US010182291B2

(12) United States Patent
Kanamori

(10) Patent No.: US 10,182,291 B2
(45) Date of Patent: Jan. 15, 2019

(54) NOISE EXTRACTING DEVICE, NOISE EXTRACTING METHOD, MICROPHONE APPARATUS, AND RECORDING MEDIUM RECORDING PROGRAM

(71) Applicant: Panasonic Intellectual Property Corporation of America, Torrance, CA (US)

(72) Inventor: Takeo Kanamori, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 15/896,432

(22) Filed: Feb. 14, 2018

(65) Prior Publication Data

US 2018/0249247 A1 Aug. 30, 2018

(30) Foreign Application Priority Data

Feb. 28, 2017 (JP) ................................ 2017-037482

(51) Int. Cl.

*H03B 29/00* (2006.01)
*H04R 3/00* (2006.01)
*G10L 21/0216* (2013.01)
*H04R 1/40* (2006.01)
*G10L 21/0208* (2013.01)

(52) U.S. Cl.

CPC .......... *H04R 3/005* (2013.01); *G10L 21/0216* (2013.01); *G10L 21/0208* (2013.01); *G10L 2021/02166* (2013.01); *H04R 1/406* (2013.01); *H04R 2410/01* (2013.01); *H04R 2410/07* (2013.01)

(58) Field of Classification Search

CPC ..................................................... H03B 29/00
See application file for complete search history.

(56) References Cited

U.S. PATENT DOCUMENTS

| | | | | |
|---|---|---|---|---|
| 9,264,797 B2 * | 2/2016 | Kanamori | .............. | H04R 3/005 |
| 10,063,957 B2 * | 8/2018 | Boesen | ................ | H04R 1/1041 |
| 2010/0026858 A1 * | 2/2010 | Kanamori | .............. | H04R 3/005 348/241 |
| 2014/0241532 A1 * | 8/2014 | Sato | ...................... | G01S 3/8083 381/56 |
| 2016/0071526 A1 * | 3/2016 | Wingate | ................ | G10L 21/028 704/233 |
| 2018/0158467 A1 * | 6/2018 | Suzuki | ..................... | H04R 3/02 |

FOREIGN PATENT DOCUMENTS

WO 2009/044562 4/2009

* cited by examiner

*Primary Examiner* — Olisa Anwah
(74) *Attorney, Agent, or Firm* — Greenblum & Bernstein, P.L.C.

(57) ABSTRACT

A noise extracting device includes first and second microphones that are provided at spatially different positions and pick up sounds, a first noise signal extractor that extracts a first noise signal included in a first signal obtained by subjecting output signals of the first and second microphones to directionality combining, a second noise signal extractor that obtains a second noise signal included in a second signal different from the first signal in a condition of the directionality combining, and a noise signal separator that separates the first and second noise signals into individual noise signals indicating noises generated in the respective first and second microphones.

14 Claims, 12 Drawing Sheets

DIRECTIONALITY CHARACTERISTICS OF SIGNAL xm0

DIRECTIONALITY CHARACTERISTICS OF SIGNAL xm1

DIRECTIONALITY CHARACTERISTICS OF SIGNAL xm2

NOISE EXTRACTING DEVICE, NOISE EXTRACTING METHOD, MICROPHONE APPARATUS, AND RECORDING MEDIUM RECORDING PROGRAM

BACKGROUND

1. Technical Field

The present disclosure relates to noise extracting devices, noise extracting methods, microphone apparatuses, and recording media recording programs.

2. Description of the Related Art

Japanese Patent No. 4990981, for example, discloses a noise extracting device that can extract a noise signal included in a directionality signal obtained by combing output signals of two microphone units. This noise extracting device extracts a noise signal by cancelling out sound wave components from a plurality of types of directionality signals on the basis of a feature that a unidirectional directionality signal of a pressure-gradient type combined through signal processing has a higher noise sensitivity than a nondirectional directionality signal obtained through signal processing.

SUMMARY

However, this existing noise extracting device is unable to estimate which noise signal comes from which microphone unit for the noise signals generated in the respective microphone units, such as vibration noises, wind noises, or noises unique to the respective microphone units that are mixed into the output signals of the two microphone units.

Furthermore, in recent years, in sound source separation, adaptive beamforming, or sound source localization, for example, array signal processing different from directionality combining of a pressure-gradient type is increasingly carried out with the use of output signals of microphone units. In the array signal processing, it is necessary to extract noise signals that are generated in respective microphone units and included in the output signals of the respective microphone units.

One non-limiting and exemplary embodiment provides a noise extracting device and a microphone apparatus that can extract noise signals generated in respective microphone units.

In one general aspect, the techniques disclosed here feature a noise extracting device, and the noise extracting device includes first and second microphones that are provided at spatially different positions and pick up sounds, a first noise signal extractor that extracts a first noise signal included in a first directionality signal obtained by subjecting output signals of the first and second microphones to directionality combining, a second noise signal extractor that obtains a second noise signal included in a second directionality signal that differs from the first directionality signal in a condition of the directionality combining, and a noise signal separator that separates the first noise signal and the second noise signal into individual noise signals indicating noises generated in the respective first and second microphones.

According to the noise extracting device and the microphone apparatus of the present disclosure, noise signals generated in respective microphone units can be extracted.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
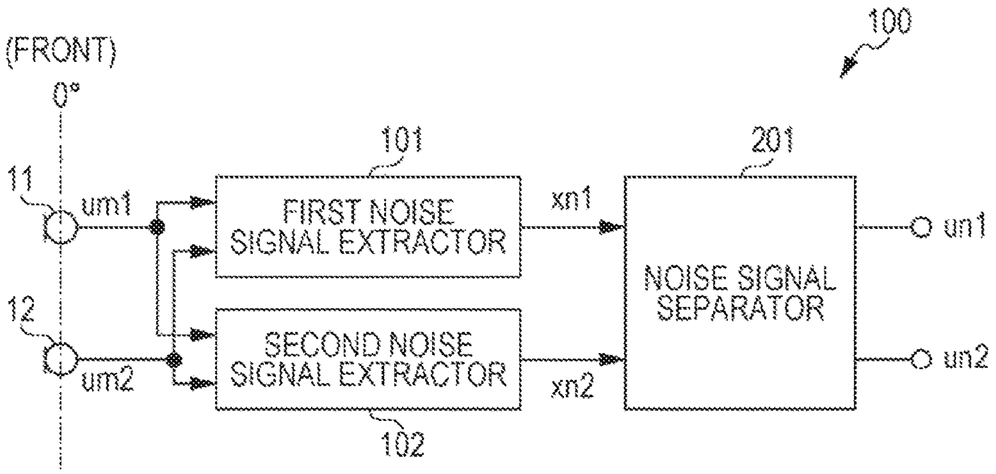
FIG. 1 is a block diagram illustrating a configuration of a noise extracting device according to a first embodiment.

Underlying Knowledge Forming Basis of the Present Disclosure

In a microphone apparatus that obtains an output by subjecting output signals of two or more microphone units to signal processing, noises generated in the two or more respective microphone units are present, such as vibration noises, wind noises, or noises unique to the respective microphone units that are mixed into the microphone units for picking up sounds. Here, the vibration noises include, for example, a touch noise transmitted to the microphone when a person operates the microphone while holding it in hand and a noise caused by vibrations such as the vibrations of the housing of the microphone unit. The wind noises are noises caused by wind, such as a noise generated as a vibration plate constituting the microphone is moved when wind blows. The noises unique to the microphone unit are noises generated by the microphone unit itself, such as a thermal noise generated in a field-effect transistor (FET) embedded, for example, in an electret condenser microphone (ECM) constituting the microphone.

In addition, the noises generated in the two or more respective microphone units in the above-described microphone apparatus are signals with no correlation between the microphone units. Meanwhile, the sound waves that the microphone apparatus picks up are signals with a correlation between the plurality of microphone units. Since the sound waves are signals with a correlation between the plurality of microphone units, a directionality signal of a pressure-gradient type obtained by combining the output signals of the two microphone units through signal processing is known to be susceptible to the noises described above.

In the noise extracting device described in Japanese Patent No. 4990981, as described above, a noise signal is extracted by cancelling out sound wave components from a plurality of types of directionality signals on the basis of a feature that a unidirectional directionality signal of a pressure-gradient type obtained by combining the output signals of the two microphone units through signal processing has a higher noise sensitivity than a nondirectional directionality signal. In other words, in the noise extracting device described in Japanese Patent No. 4990981, a noise signal included in a directionality signal obtained by combining the output signals of the plurality of microphone units can be extracted.

However, the noise extracting device described in Japanese Patent No. 4990981 suffers from shortcomings in that it is not possible to estimate which noise signal comes from which microphone unit for the noise signals generated in the respective microphone units that are mixed into the respective output signals of the two microphone units.

Furthermore, in recent years, in sound source separation, adaptive beamforming, or sound source localization, array signal processing is increasingly carried out with the use of output signals of microphone units, and it is necessary to extract noise signals included in signals of respective microphone units.

Accordingly, the inventors have conceived of a noise extracting device that can extract noise signals generated in respective microphone units.

Specifically, a noise extracting device according to an aspect of the present disclosure includes first and second microphones that are provided at spatially different positions and pick up sounds, a first noise signal extractor that extracts a first noise signal included in a first directionality signal obtained by subjecting output signals of the first and second microphones to directionality combining, a second noise signal extractor that obtains a second noise signal included in a second directionality signal that differs from the first directionality signal in a condition of the directionality combining, and a noise signal separator that separates the first noise signal and the second noise signal into individual noise signals indicating noises generated in the respective first and second microphones.

With this configuration, for two or more microphones provided at spatially different positions, noise signals of vibration noises, wind noises, noises unique to the microphones, or the like mixed in acoustic signals can be extracted for the respective microphones.

Herein, for example the noise signal separator may obtain the individual noise signals by transforming the first noise signal and the second noise signal in accordance with a relational expression between the first and second noise signals and the individual noise signals derived from a relational expression indicating a relationship between the first and second directionality signals and the output signals of the first and second microphones.

In addition, for example, the second noise signal extractor may generate the second directionality signal by subjecting the output signals of the first and second microphones to the directionality combining and extract the second noise signal included in the second directionality signal.

Herein, for example, the first noise signal extractor and the second noise signal extractor may each include a directionality combiner that subjects the output signals of the first and second microphones to the directionality combining to generate first and second directionality signals having different noise sensitivities, having matching directionality characteristics to a sound pressure, and having matching acoustic center positions; a signal cancellation calculator that subtracts the first directionality signal from the second directionality signal to cancel out an acoustic component from the second directionality signal and extracts an amplitude value of a noise component; and a signal reconstructor that reconstructs a noise waveform signal from one of two unidirectional signals with different principal axis directions that have been added to one of the first and second directionality signals having a higher noise sensitivity and outputs the noise waveform signal.

In addition, for example, the principal axis direction of the directionality of the first directionality signal and the principal axis direction of the directionality of the second directionality signal may be opposite to each other.

In addition, for example, the second noise signal may be in an opposite phase to the first noise signal, and the second noise signal extractor may obtain the second noise signal by inverting the phase of the first noise signal output from the first noise signal extractor.

In addition, for example, the principal axis direction of the directionality of the first directionality signal and the principal axis direction of the directionality of the second directionality signal may be the same as each other, and the first directionality signal and the second directionality signal may have different combining coefficients used when the output signals of the first and second microphones are subjected to the directionality combining.

In addition, for example, the combining coefficients may be gain values, and the first directionality signal and the second directionality signal may be obtained through the directionality combining in which one of the output signals of the first and second microphones is multiplied by different gain values.

In addition, for example, the individual noise signals may indicate noises including at least one of wind noises and vibration noises generated in the respective first and second microphones.

A microphone apparatus according to another aspect of the present disclosure includes the noise extracting device according to any one of the foregoing aspects, and first and second signal subtractors that subtract the individual noise signals from the output signals of the first and second microphones to obtain acoustic signals of acoustic components observed in the respective first and second microphones.

A microphone apparatus according to yet another aspect of the present disclosure includes the noise extracting device according the foregoing aspects, and first and second signal subtractors that subtract the individual noise signals from the output signals of the first and second microphones to obtain first acoustic signals of acoustic components observed in the respective first and second microphones. The first and second signal subtractors output the first acoustic signals to the noise extracting device as the output signals of the first and second microphones and subtract, from the first acoustic signals, the individual noise signals indicating noises generated in the respective first and second microphones included in the first acoustic signals output from the noise extracting device to obtain second acoustic signals of acoustic components observed in the respective first and second microphones.

Herein, for example, the first and second signal subtractors may output the first acoustic signals to the first noise signal extractor and the second noise signal extractor as the output signals of the respective first and second microphones, the first noise signal extractor and the second noise signal extractor may extract a third noise signal included in a third directionality signal obtained by subjecting the first acoustic signals to the directionality combining and a fourth noise signal included in a fourth directionality signal obtained by subjecting the first acoustic signals to the directionality combining under a condition different from that of the third directionality signal and output the third noise signal and the fourth noise signal to the noise signal separator, the noise signal separator may separate the third noise signal and the fourth noise signal into individual noise signals indicating noises generated in the respective first and second microphones included in the first acoustic signals and output the individual noise signals to the first and second signal subtractors, and the first and second signal subtractors may subtract, from the first acoustic signals, the individual noise signals indicating the noises generated in the respective first and second microphones included in the first acoustic signals output from the noise signal separator.

It is to be noted that the present disclosure can be implemented not only in the form of an apparatus but also in the form of an integrated circuit provided with processing units that such an apparatus includes, in the form of a method including steps carried out by processing units constituting the apparatus, in the form of a program that causes a computer to execute the steps, or in the form of information, data, or signals that express the program. In addition, such program, information, data, and signals may be distributed in the form of a recording medium such as a CD-ROM or via a communication medium such as the internet.

Hereinafter, embodiments of the present disclosure will be described with reference to the drawings. It is to be noted that the embodiments described hereinafter merely illustrate specific, preferable examples of the present disclosure. The numerical values, the shapes, the materials, the constituent elements, the arrangement positions and the connection modes of the constituent elements, the steps, the order of the steps, and so forth indicated in the following embodiments are examples and are not intended to limit the present disclosure. In addition, among the constituent elements in the following embodiments, constituent elements that are not included in independent claims reciting the broadest concept of the present disclosure are described as optional constituent elements that constitute more preferable modes. In the present specification and the drawings, constituent elements having substantially identical functional configurations are given identical reference characters, and duplicate descriptions thereof will be omitted.

First Embodiment

Noise Extracting Device 100

FIG. 1 is a block diagram illustrating a configuration of a noise extracting device 100 according to a first embodiment. In the following descriptions, the first letter of the signal name of each signal in the time domain is written in lower case, and the first letter of the signal name of each signal in the frequency domain is written in upper case. In addition, xm0($n$) is written as xm0, and Xm0($\omega$) is written as Xm0.

The noise extracting device 100 illustrated in FIG. 1 includes a first microphone unit 11, a second microphone unit 12, a first noise signal extractor 101, a second noise signal extractor 102, and a noise signal separator 201.

First Microphone Unit 11 and Second Microphone Unit 12

The first microphone unit 11 and the second microphone unit 12 are provided at spatially different positions and pick up sounds. The first microphone unit 11 and the second microphone unit 12 each output a signal of a picked-up sound wave. In the present embodiment, the first microphone unit 11 outputs, as a signal of a picked-up sound wave, an output signal um1 to the first noise signal extractor 101 and the second noise signal extractor 102. In a similar manner, the second microphone unit 12 outputs, as a signal of a picked-up sound wave, an output signal um2 to the first noise signal extractor 101 and the second noise signal extractor 102. The inter-microphone unit distance d between the first microphone unit 11 and the second microphone unit 12 may be, for example, approximately 5 mm to 20 mm, in order to carry out directionality combining of a pressure-gradient type as described later.

First Noise Signal Extractor 101

Figure 2:
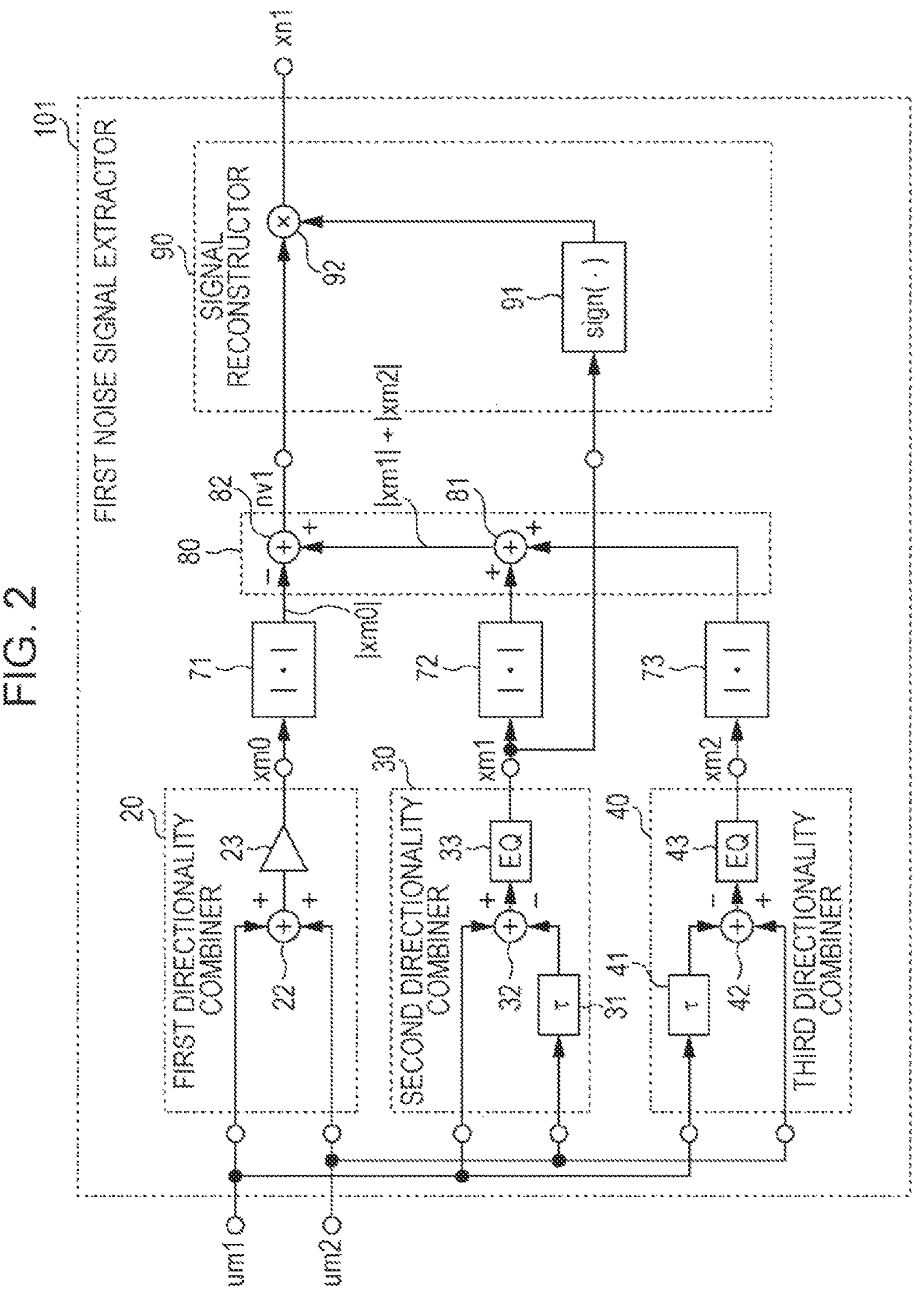
FIG. 2 is a block diagram illustrating a detailed configuration of a first noise signal extractor according to the first embodiment.

FIG. 2 is a block diagram illustrating a detailed configuration of the first noise signal extractor 101 according to the first embodiment.

The first noise signal extractor 101 extracts a first noise signal included in a first directionality signal obtained by subjecting output signals of the first microphone unit 11 and the second microphone unit 12 to directionality combining. In the present embodiment, as illustrated in FIG. 1, the first noise signal extractor 101 receives inputs of the output signal um1 of the first microphone unit 11 and the output signal um2 of the second microphone unit 12 and outputs a noise signal xn1 included in the combined directionality signal.

To be more specific, as illustrated in FIG. 2, the first noise signal extractor 101 includes a first directionality combiner 20, a second directionality combiner 30, a third directionality combiner 40, a first signal absolute value calculator 71, a second signal absolute value calculator 72, a third signal absolute value calculator 73, a signal cancellation calculator 80, and a signal reconstructor 90. The first noise signal corresponds to the noise signal xn1, and the first directionality signal corresponds to a signal xm1 output by the second directionality combiner 30.

First Directionality Combiner 20

Figure 3A:
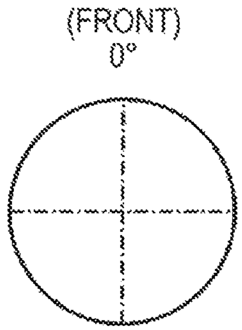
FIG. 3A illustrates directionality characteristics of a signal output by a first directionality combiner.

FIG. 3A illustrates the directionality characteristics of a signal xm0 output by the first directionality combiner 20.

As illustrated in FIG. 2, the first directionality combiner 20 includes a signal adder 22 that carries out an addition of signals, that is, carries out directionality combining of an addition type and a signal amplifier 23 that amplifies a signal by adjusting the gain. To be more specific, the first directionality combiner 20 adds the output signal um1 and the output signal um2 in the signal adder 22 and outputs the signal xm0 amplified in the signal amplifier 23. In this manner, the first directionality combiner 20 obtains the signal xm0 having a low sensitivity to noises such as a vibration noise and a wind noise and obtained through nondirectional directionality combining with the use of the output signal um1 of the first microphone unit 11 and the output signal um2 of the second microphone unit 12. The signal xm0 has nondirectional directionality characteristics as illustrated in FIG. 3A, for example. FIG. 3A illustrates a polar pattern of the signal xm0 output by the first directionality combiner 20, and the sensitivity of the signal xm0 is indicated for each direction of the directionality characteristics. The signal xm0 output by the first directionality combiner 20 has been subjected to signal processing through the directionality combining of an addition type and has a high absolute value of the sound pressure sensitivity. On the other hand, the signal xm0 has a relatively low sensitivity to the noises generated in the respective microphone units, such as vibration noises, wind noises, or noises unique to the respective microphone units.

Second Directionality Combiner 30

Figure 3B:
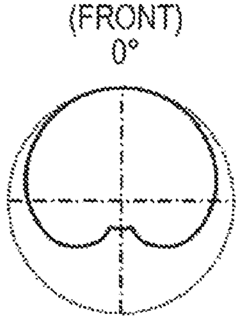
FIG. 3B illustrates directionality characteristics of a signal output by a second directionality combiner.

FIG. 3B illustrates the directionality characteristics of the signal xm1 output by the second directionality combiner 30.

As illustrated in FIG. 2, the second directionality combiner 30 includes a signal delayer 31 that delays a signal, a signal subtractor 32 that carries out a subtraction of signals, that is, carries out directionality combining of a pressure-gradient type, and a frequency characteristics corrector 33 that corrects the frequency characteristics of a signal. To be more specific, the second directionality combiner 30 delays the output signal um2 in the signal delayer 31 by a delay time τ, subtracts the delayed output signal um2 from the output signal um1 in the signal subtractor 32, and outputs the signal xm1 of which the frequency characteristics have been corrected in the frequency characteristics corrector 33.

In this manner, the second directionality combiner 30 obtains the signal xm1 having a high sensitivity to noises such as a vibration noise and a wind noise and obtained through the directionality combining of a pressure-gradient type with the use of the output signal um1 of the first microphone unit 11 and the output signal um2 of the second microphone unit 12.

The signal xm1 has directionality characteristics as illustrated in FIG. 3B, for example. FIG. 3B illustrates a polar pattern of the signal xm1 output by the second directionality combiner 30, and the sensitivity of the signal xm1 is indicated for each direction of the directionality characteristics. As illustrated in FIG. 3B, the signal xm1 output by the second directionality combiner 30 has the directionality characteristics in which the front along the axis of directionality is oriented toward the first microphone unit 11 in the line connecting the first microphone unit 11 and the second microphone unit 12. Since the signal xm1 has been subjected to signal processing through the directionality combining of a pressure-gradient type (subtraction type) as described above, the signal xm1 has a lower absolute value of the sound pressure sensitivity than does a signal obtained through the directionality combining of an addition type. On the other hand, the signal xm1 has a relatively high sensitivity to the noises generated in the respective microphone units, such as vibration noises, wind noises, or noises unique to the respective microphone units.

The signal xm1 output by the second directionality combiner 30 can be expressed as in the following expression (1) with the use of a typical pressure-gradient type directionality combining formula. Xm1, Um1, and Um2 represent the signals xm1, um1, and um2, which are represented in the time domain, in the frequency domain.

$$Xm1(\omega)=(Um1(\omega)-Um2(\omega)\cdot e^{-j\omega\tau})/(1-A\cdot e^{-j\omega\tau}) \quad (1)$$

In the above, τ represents the delay time. For example, when unidirectional signals are combined, τ=d/c is set, in which d is the inter-microphone element distance, which is the distance between the first microphone unit 11 and the second microphone unit 12, and c is the speed of sound. In addition, A is a coefficient for preventing divergence and is set to a value smaller than 1.

In the above expression (1), the signal delayer 31 carries out the calculation of "$e^{-j\omega\tau}$," the signal subtractor 32 carries out the calculation of "−" in the numerator, namely, the calculation of the subtraction operator in the numerator, and the frequency characteristics corrector 33 carries out the calculation of "$1/(1-A\cdot e^{-j\omega\tau})$."

Third Directionality Combiner 40

Figure 3C:
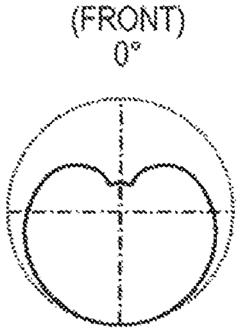
FIG. 3C illustrates directionality characteristics of a signal output by a third directionality combiner.

FIG. 3C illustrates the directionality characteristics of a signal xm2 output by the third directionality combiner 40.

As illustrated in FIG. 2, the third directionality combiner 40 includes a signal delayer 41 that delays a signal, a signal subtractor 42 that carries out a subtraction of signals, that is, carries out directionality combining of a pressure-gradient type, and a frequency characteristics corrector 43 that corrects the frequency characteristics of a signal. To be more specific, the third directionality combiner 40 delays the output signal um1 in the signal delayer 41 by the delay time τ, subtracts the delayed output signal um1 from the output signal um2 in the signal subtractor 42, and outputs the signal xm2 of which the frequency characteristics have been corrected in the frequency characteristics corrector 43.

In this manner, the third directionality combiner 40 obtains the signal xm2 having a high sensitivity to noises such as a vibration noise and a wind noise and obtained through the directionality combining of a pressure-gradient type with the use of the output signal um1 of the first microphone unit 11 and the output signal um2 of the second microphone unit 12.

The signal xm2 has directionality characteristics as illustrated in FIG. 3C, for example. FIG. 3C illustrates a polar pattern of the signal xm2 output by the third directionality combiner 40, and the sensitivity of the signal xm2 is indicated for each direction of the directionality characteristics. As illustrated in FIG. 3C, the signal xm2 output by the third directionality combiner 40 has the directionality characteristics in which the front along the axis of directionality is oriented toward the second microphone unit 12 in the line connecting the first microphone unit 11 and the second microphone unit 12. Since the signal xm2 has been subjected to signal processing through the directionality combining of a pressure-gradient type (subtraction type) as in the signal xm1, the signal xm2 has a lower absolute value of the sound pressure sensitivity than does a signal obtained through the directionality combining of an addition type. On the other hand, the signal xm2 has a relatively high sensitivity to the noises generated in the respective microphone units, such as vibration noises, wind noises, or noises unique to the respective microphone units.

The signal xm2 output by the third directionality combiner 40 can be expressed as in the following expression (2) with the use of a typical pressure-gradient type directionality combining formula. Xm2, Um1, and Um2 represent the signals xm2, um1, and um2, which are represented in the time domain, in the frequency domain.

$$Xm2(\omega)=(Um2(\omega)-Um1(\omega)\cdot e^{-j\omega\tau})/(1-A\cdot e^{-j\omega\tau}) \quad (2)$$

In the above, the delay time τ and the coefficient A are the same as those described for the expression (1).

In the above expression (2), the signal delayer 41 carries out the calculation of "$e^{-j\omega\tau}$," the signal subtractor 42 carries out the calculation of "−" in the numerator, namely, the calculation of the subtraction operator in the numerator, and the frequency characteristics corrector 43 carries out the calculation of "$1/(1-A\cdot e^{-j\omega\tau})$."

First Signal Absolute Value Calculator 71

The first signal absolute value calculator 71 calculates the absolute value of the output signal of the first directionality combiner 20. In the present embodiment, the first signal absolute value calculator 71 outputs, to the signal cancellation calculator 80, a signal |xm0| obtained by calculating the absolute value of the signal xm0 output from the first directionality combiner 20.

Second Signal Absolute Value Calculator 72

The second signal absolute value calculator 72 calculates the absolute value of the output signal of the second directionality combiner 30. In the present embodiment, the second signal absolute value calculator 72 outputs, to the signal cancellation calculator 80, a signal |xm1| obtained by calculating the absolute value of the signal xm1 output from the second directionality combiner 30.

Third Signal Absolute Value Calculator 73

The third signal absolute value calculator 73 calculates the absolute value of the output signal of the third directionality combiner 40. In the present embodiment, the third signal absolute value calculator 73 outputs, to the signal cancellation calculator 80, a signal |xm2| obtained by calculating the absolute value of the signal xm2 output from the third directionality combiner 40.

Signal Cancellation Calculator 80

As illustrated in FIG. 2, the signal cancellation calculator 80 includes a signal adder 81 that carries out an addition of signals and a signal subtractor 82 that carries out a subtraction of signals. To be more specific, the signal cancellation calculator 80 receives inputs of the signal |xm0| output from the first signal absolute value calculator 71, the signal |xm1| output from the second signal absolute value calculator 72, and the signal |xm2| output from the third signal absolute value calculator 73. The signal cancellation calculator 80 carries out a calculation for cancelling out acoustic signal components with respect to sound waves from the input signals to extract a signal nv1 indicating a noise signal amplitude and outputs the extracted signal nv1 to the signal reconstructor 90.

The signal nv1 output by the signal cancellation calculator 80 can be expressed as in the following expression (3). In other words, the signal cancellation calculator 80 carries out the calculation expressed by the expression (3). Nv1, Xm0, Xm1, and Xm2 represent the signals nv1, xm0, xm1, and xm2, which are represented in the time domain, in the frequency domain.

$$Nv1(\omega)=(|Xm1(\omega)|+|Xm2(\omega)|)-|Xm0(\omega)| \quad (3)$$

In the above expression (3), the signal adder 81 carries out the calculation of "+," namely, the calculation of the addition operator, and the signal subtractor 82 carries out the calculation of "−," namely, the calculation of the subtraction operator.

The term |Xm0(ω)| in the above expression (3) represents a directionality signal having a low sensitivity to noises such as a vibration noise and a wind noise and being nondirectional to sound waves. In addition, the term (|Xm1(ω)|+|Xm2(ω)|) in the above expression (3) represents a directionality signal having a high sensitivity to noises such as a vibration noise and a wind noise and being nondirectional to sound waves. In FIG. 2, the term (|Xm1(ω)|+|Xm2(ω)|) indicates that the signal adder 81 adds the two unidirectional signals (signals xm1 and xm2) having different principal axis directions output from the second directionality combiner 30 and the third directionality combiner 40 to generate a directionality signal having a high sensitivity to the aforementioned noises and being nondirectional to sound waves. Then, on the basis of these characteristics, the signal cancellation calculator 80 cancels out the sound wave components to extract the signal nv1 indicating the noise signal amplitude. In other words, in FIG. 2, the above expression (3) indicates that the signal cancellation calculator 80 subtracts one of the two directionality signals having different noise sensitivities, having matching directionality characteristics to the sound pressure, and having matching acoustic center positions from the other one of the two directionality signals to cancel out the acoustic component from the other one of the directionality signals and extracts the amplitude value of the noise component.

Signal Reconstructor 90

The signal reconstructor 90 reconstructs a noise waveform signal from one of the two unidirectional signals (signals xm1 and xm2) having different principal axis directions added to the directionality signal of the two directionality signals that has a higher noise sensitivity and the signal nv1 output from the signal cancellation calculator 80 and outputs the reconstructed noise waveform signal.

In the present embodiment, as illustrated in FIG. 2, the signal reconstructor 90 includes a signal sign extractor 91 that extracts the sign (the phase when frequency domain processing is carried out) of a signal and a signal multiplier 92 that carries out a multiplication of signals. To be more specific, the signal reconstructor 90 extracts the sign (the phase when frequency domain processing is carried out) of the signal xm1 output from the second directionality combiner 30 in the signal sign extractor 91, multiplies the sign by the signal nv1 indicating the noise signal amplitude in the signal multiplier 92, and obtains (reconstructs) the noise signal xn1. The signal reconstructor 90 outputs the reconstructed noise signal xn1 to the noise signal separator 201.

In this manner, the first noise signal extractor 101 can obtain the noise signal xn1 included in the signal xm1, which is the directionality signal indicating unidirectionality, output from the second directionality combiner 30.

Second Noise Signal Extractor 102

Figure 4:
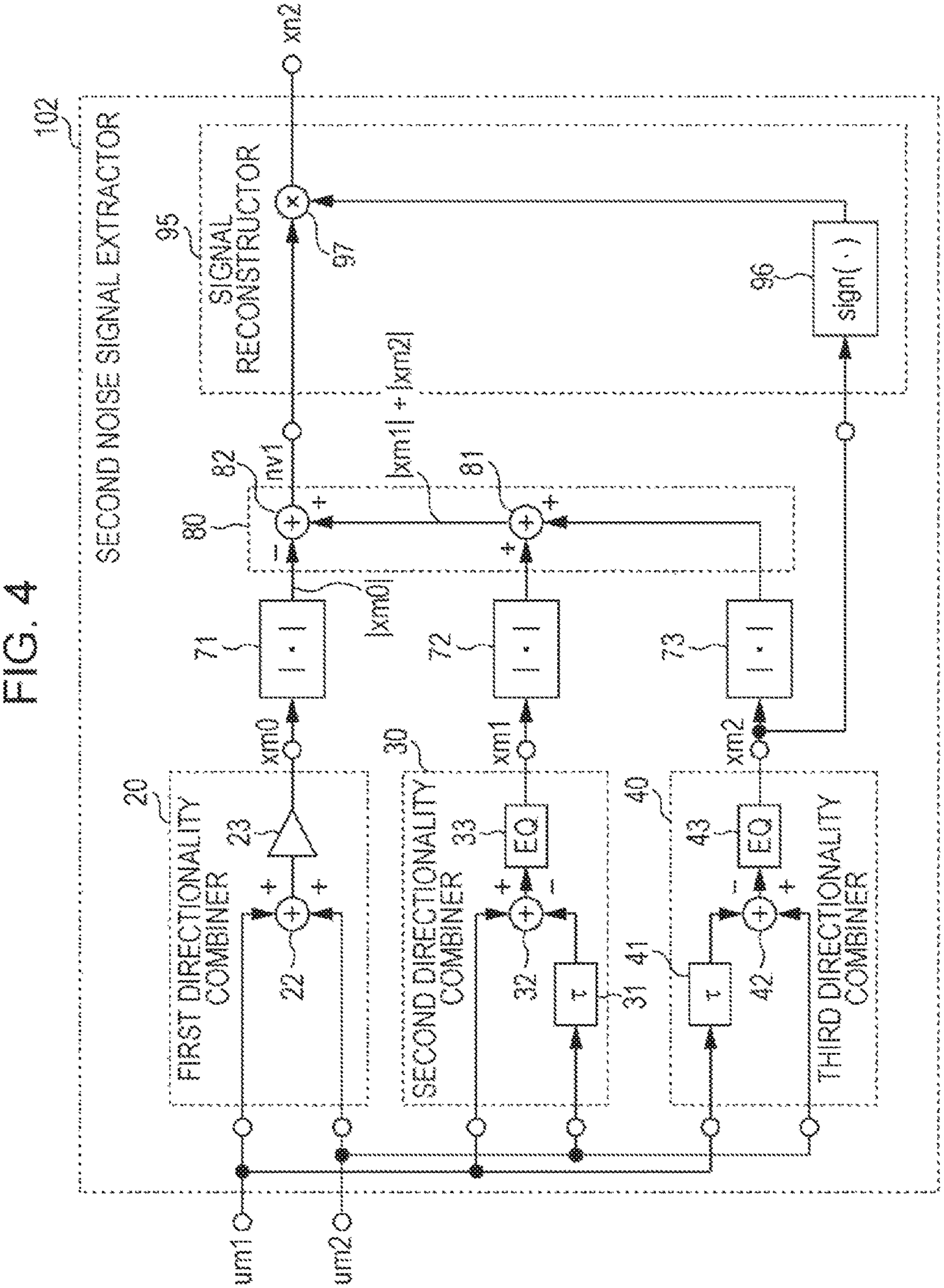
FIG. 4 is a block diagram illustrating a detailed configuration of a second noise signal extractor according to the first embodiment.

FIG. 4 is a block diagram illustrating a detailed configuration of the second noise signal extractor 102 according to the first embodiment. Elements that are similar to those illustrated in FIG. 2 are given identical reference characters.

The second noise signal extractor 102 obtains a second noise signal included in a second directionality signal that differs from the first directionality signal in terms of the condition of directionality combining. Specifically, the second noise signal extractor 102 generates the second directionality signal by carrying out directionality combining of the output signal of the first microphone unit 11 and the output signal of the second microphone unit 12 and extracts the second noise signal included in the second directionality signal. Herein, the principal axis direction of the directionality of the first directionality signal and the principal axis direction of the directionality of the second directionality signal are opposite to each other. In the present embodiment, as illustrated in FIG. 1, the second noise signal extractor 102 receives inputs of the output signal um1 of the first microphone unit 11 and the output signal um2 of the second microphone unit 12. Then, the second noise signal extractor 102 outputs a noise signal xn2 included in the directionality signal indicating the directionality characteristics different from those of the directionality signal that includes the noise signal xn1 output by the first noise signal extractor 101.

To be more specific, as illustrated in FIG. 4, the second noise signal extractor 102 includes a first directionality combiner 20, a second directionality combiner 30, a third directionality combiner 40, a first signal absolute value calculator 71, a second signal absolute value calculator 72, a third signal absolute value calculator 73, a signal cancellation calculator 80, and a signal reconstructor 95. The second noise signal corresponds to the noise signal xn2, and the second directionality signal corresponds to a signal xm2 output by the third directionality combiner 40.

The second noise signal extractor 102 illustrated in FIG. 4 differs from the first noise signal extractor 101 illustrated in FIG. 2 in terms of the configuration of the signal reconstructor 95 and in that the signal xm2, which is a directionality signal, output from the third directionality combiner 40 is input to the signal reconstructor 95. Hereinafter, the differences from the first noise signal extractor 101 illustrated in FIG. 2 will be described.

Signal Reconstructor 95

As illustrated in FIG. 4, the signal reconstructor 95 includes a signal sign extractor 96 that extracts the sign (the phase when frequency domain processing is carried out) of a signal and a signal multiplier 97 that carries out a multiplication of signals. To be more specific, the signal reconstructor 95 extracts the sign (the phase when frequency domain processing is carried out) of the signal xm2 output from the third directionality combiner 40 in the signal sign extractor 96, multiplies the sign by a signal nv1 indicating the noise signal amplitude in the signal multiplier 97, and obtains (reconstructs) the noise signal xn2. The signal reconstructor 95 outputs the reconstructed noise signal xn2 to the noise signal separator 201.

In this manner, the second noise signal extractor 102 can obtain the noise signal xn2 included in the signal xm2, which is a directionality signal indicating unidirectionality, output from the third directionality combiner 40. The signal xm2 output by the third directionality combiner 40 and the signal xm1 output by the second directionality combiner 30 differ from each other in terms of the principal axis direction of the directionality, as described with reference to FIG. 3B and FIG. 3C. In other words, the second noise signal extractor 102 and the first noise signal extractor 101 can extract the noise signals (noise signals xn2 and xn1) included in the respective directionality signals (signals xm2 and xm1) that differ from each other in terms of the principal axis direction of the directionality.

Noise Signal Separator 201

Figure 5:
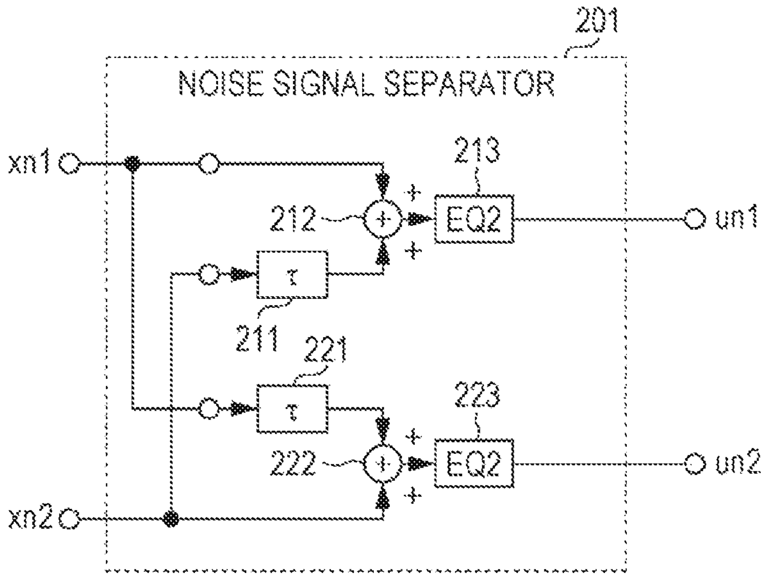
FIG. 5 is a block diagram illustrating a detailed configuration of a noise signal separator according to the first embodiment.

FIG. 5 is a block diagram illustrating a detailed configuration of the noise signal separator 201 according to the first embodiment.

The noise signal separator 201 separates the first noise signal and the second noise signal into individual noise signals indicating the noises generated in the respective first and second microphone units 11 and 12. The noise signal separator 201 obtains the individual noise signals by transforming the first noise signal and the second noise signal in accordance with a relational expression between the first and second noise signals and the individual noise signals derived from a relational expression indicating a relationship between the first and second directionality signals and the output signals of the first microphone unit 11 and the second microphone unit 12. In the present embodiment, as illustrated in FIG. 1, the noise signal separator 201 receives inputs of the noise signal xn1 and the noise signal xn2 output from the first noise signal extractor 101 and the second noise signal extractor 102, respectively. Then, the noise signal separator 201 separates the noise signal xn1 and the noise signal xn2 into an individual noise signal un1 and an individual noise signal un2 indicating the noises included in the first microphone unit 11 and the second microphone unit 12, respectively, and outputs the separated individual noise signal un1 and individual noise signal un2.

To be more specific, as illustrated in FIG. 5, the noise signal separator 201 includes a signal delayer 211, a signal adder 212, a frequency characteristics corrector 213, a signal delayer 221, a signal adder 222, and a frequency characteristics corrector 223.

The signal delayer 211 and the signal delayer 221 each delay an input signal and output the delayed signal. Specifically, the signal delayer 211 delays the noise signal xn2 output from the second noise signal extractor 102 by the delay time $\tau$ and outputs the delayed noise signal xn2 to the signal adder 212. The signal delayer 221 delays the noise signal xn1 output from the first noise signal extractor 101 by the delay time $\tau$ and outputs the delayed noise signal xn1 to the signal adder 222.

The signal adder 212 and the signal adder 222 each carry out an addition of input signals. Specifically, the signal adder 212 adds the noise signal xn1 output from the first noise signal extractor 101 and the noise signal xn2 output from the signal delayer 211 and having been delayed by the delay time $\tau$ and outputs the result to the frequency characteristics corrector 213. The signal adder 222 adds the noise signal xn1 output from the signal delayer 221 and having been delayed by the delay time $\tau$ and the noise signal xn2 output from the second noise signal extractor 102 and outputs the result to the frequency characteristics corrector 223.

The frequency characteristics corrector 213 and the frequency characteristics corrector 223 each correct the frequency characteristics of a signal. Specifically, the frequency characteristics corrector 213 outputs the individual noise signal un1 obtained by correcting the frequency characteristics of the signal output from the signal adder 212. The frequency characteristics corrector 223 outputs the individual noise signal un2 obtained by correcting the frequency characteristics of the signal output from the signal adder 222.

The following description illustrates that the two noise signals xn1 and xn2 included in the two directionality signal patterns (signals xm1 and xm2) can be transformed into the individual noise signals un1 and un2 included in the respective output signals um1 and um2 of the two microphone units.

The relationship between the output signals um1 and um2 of the first and second microphone units 11 and 12 and the signals xm1 and xm2 output by the second directionality combiner 30 and the third directionality combiner 40 can be expressed as in the following expression (4) by combining the expression (1) and the expression (2) described above.

$$\begin{bmatrix} Xm1(\omega) \\ Xm2(\omega) \end{bmatrix} = \frac{1}{(1 - A \cdot e^{-j\omega\tau})} \begin{bmatrix} 1 & -e^{-j\omega\tau} \\ -e^{-j\omega\tau} & 1 \end{bmatrix} \begin{bmatrix} Um1(\omega) \\ Um2(\omega) \end{bmatrix} \tag{4}$$

The relational expression for deriving the output signals um1 and um2 of the first and second microphone units from the signals xm1 and xm2, which are directionality signals, can be expressed as in the following expression (5) by multiplying both sides of the above expression (4) by the reciprocal and the inverse matrix.

$$\left(\frac{1}{(1-A\cdot e^{-j\omega\tau})}\right)^{-1}\begin{bmatrix}1 & -e^{-j\omega\tau}\\ -e^{-j\omega\tau} & 1\end{bmatrix}^{-1}\begin{bmatrix}Xm1(\omega)\\ Xm2(\omega)\end{bmatrix}=\begin{bmatrix}Um1(\omega)\\ Um2(\omega)\end{bmatrix} \quad (5)$$

Furthermore, when the right-hand side and the left-hand side of the above expression (5) are switched and the expression is cleaned up, the result can be expressed as in the following expression (6).

$$\begin{bmatrix}Um1(\omega)\\ Um2(\omega)\end{bmatrix}=\left(\frac{1}{(1+A\cdot e^{-j\omega\tau})}\right)\begin{bmatrix}1 & e^{-j\omega\tau}\\ e^{-j\omega\tau} & 1\end{bmatrix}\begin{bmatrix}Xm1(\omega)\\ Xm2(\omega)\end{bmatrix} \quad (6)$$

When the inverse matrix on the left-hand side of the expression (5) is calculated, the coefficient A for preventing divergence similar to that in the expression (1) and the expression (2) described above is used in deriving.

The relational expression indicated in the above expression (6) is a transformation for obtaining the output signals um1 and um2 of the first and second microphone units from the signals xm1 and xm2, which are two directionality signal patterns.

When the noise signals xn1 and xn2 included in the signals xm1 and xm2, which are two directionality signal patterns, are substituted into the above expression (6), the transformation (relational expression) indicated in the following expression (7) is obtained. In other words, the use of the transformation indicated in the following expression (7) makes it possible to obtain the individual noise signals un1 and un2 included in the output signals um1 and um2 of the first and second microphone units from the noise signals xn1 and xn2 included in the signals xm1 and xm2, which are two directionality signal patterns.

$$\begin{bmatrix}Un1(\omega)\\ Un2(\omega)\end{bmatrix}=\left(\frac{1}{(1+A\cdot e^{-j\omega\tau})}\right)\begin{bmatrix}1 & e^{-j\omega\tau}\\ e^{-j\omega\tau} & 1\end{bmatrix}\begin{bmatrix}Xn1(\omega)\\ Xn2(\omega)\end{bmatrix} \quad (7)$$

In this manner, the above expression (7) indicating the relational expression between the noise signals xn1 and xn2 and the individual noise signals un1 and un2 can be derived from the relational expression indicating the relationship between the signals xm1 and xm2, which are directionality signals, and the output signals um1 and um2 of the first and second microphone units 11 and 12.

In other words, the noise signal separator 201 can obtain the individual noise signals un1 and un2 by transforming the noise signals xn1 and xn2 in accordance with the above expression (7) indicating the relational expression between the noise signals xn1 and xn2 and the individual noise signals un1 and un2. The noise signal separator 201 illustrated in FIG. 5 corresponds to what is obtained by expressing the above expression (7) in a block diagram. In the above expression (7), the signal delayers 211 and 221 carry out the calculation of "$e^{-j\omega\tau}$" in order to delay the signals by the delay time $\tau$, and the signal adders 212 and 222 carry out the calculation of the addition part of the matrix operation. The frequency characteristics correctors 213 and 223 (EQ2) carry out the calculation of the term that includes the coefficient A in the above expression (7), namely, the calculation of the right-hand side of the following expression (8).

$$EQ2(\omega)=\frac{1}{(1+A\cdot e^{-j\omega\tau})} \quad (8)$$

Advantageous Effects and Others

As described above, according to the present embodiment, the noise extracting device 100 that can extract individual noise signals generated in the respective microphone units can be achieved.

To be more specific, the first and second noise signal extractors 101 and 102 extract the noise signals xn1 and xn2 included in the signals xm1 and xm2, which are directionality signals, of which the directionalities are oriented in opposite directions from the output signals um1 and um2 of the first and second microphone units 11 and 12. Then, the noise signal separator 201 transforms (separates) the noise signals xn1 and xn2 into the individual noise signals un1 and un2 included in the respective first and second microphone units 11 and 12 and outputs the resulting individual noise signals un1 and un2. In this manner, the noise extracting device 100 according to the present embodiment can extract the noise components mixed in the respective first and second microphone units 11 and 12.

The noise extracting device disclosed in Japanese Patent No. 4990981 described above can also extract a noise signal of a vibration noise or a wind noise included in a directionality signal obtained by combining output signals of two microphone units. However, the noise extracting device disclosed in Japanese Patent No. 4990981 described above merely derives a single noise signal included a single directionality signal pattern and thus cannot derive individual noise signals included in the two respective microphone units prior to the directionality combining. In order to derive individual noise signals included in the two respective microphone units prior to the directionality combining, the number of unknowns is two, and thus the individual noise signals cannot be derived with a single noise signal.

In contrast, the noise extracting device according to the present embodiment extracts two noise signals included in the two respective different directionality signal patterns and can thus derive individual noise signals included in the two respective microphone units prior to the directionality combining. Thus, as described above, the noise extracting device 100 according to the present embodiment extracts two noise signals included in the two respective different directionality signal patterns in the first noise signal extractor 101 and the second noise signal extractor 102. Then, the noise signal separator 201 carries out signal processing to separate the extracted two noise signals into individual noise signals corresponding to the noise components mixed in the respective microphone units. In this manner, the noise extracting device 100 according to the present embodiment can extract the individual noise signals un1 and un2 generated in the respective microphone units.

The individual noise signals un1 and un2 represent the vibration noises, the wind noises, or the noises unique to the respective microphone units described above and may also represent noises generated in the respective microphone units at amplifiers or the like to which the microphone units are connected.

First Modification

Figure 6:
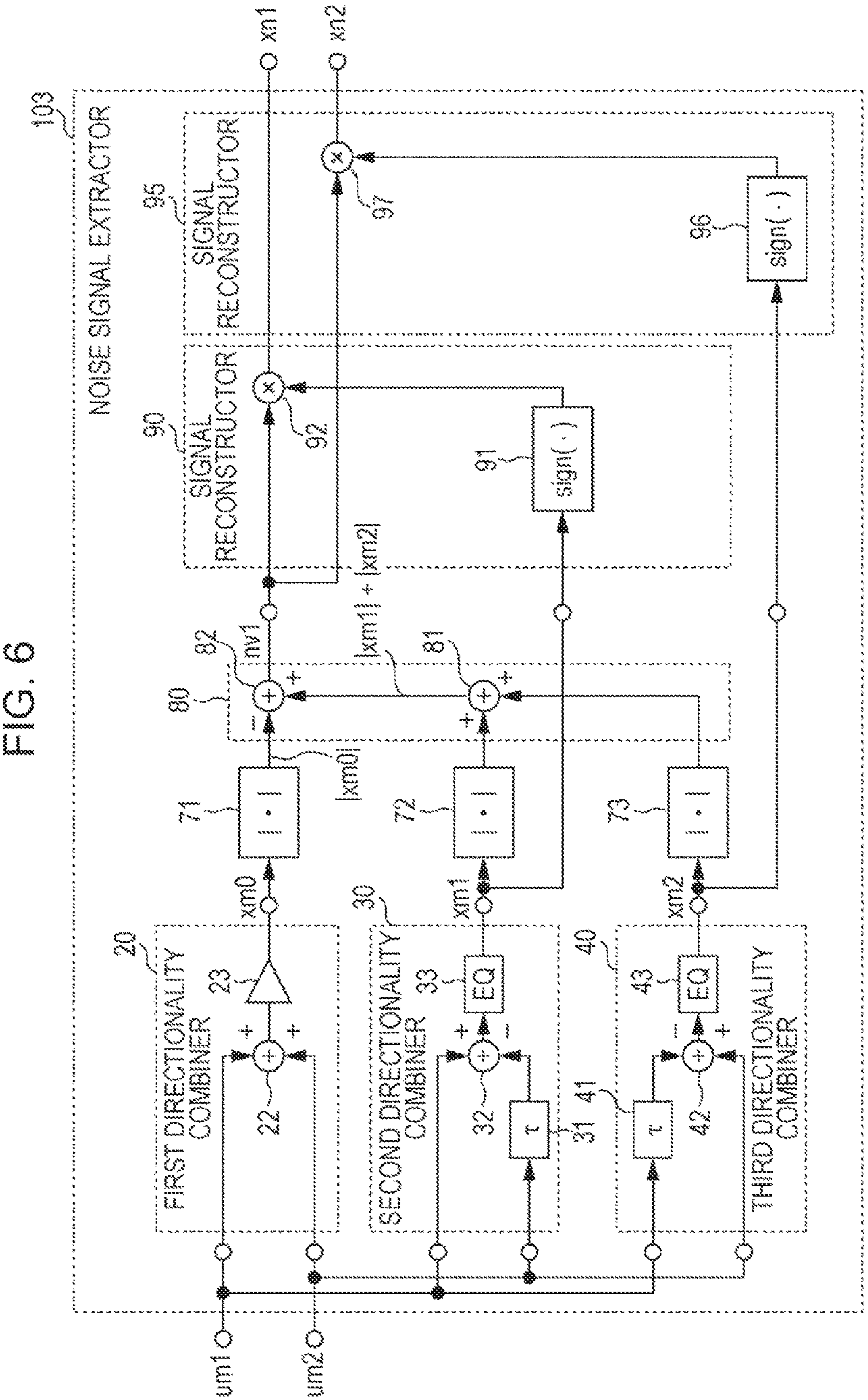
FIG. 6 is a block diagram illustrating a detailed configuration of a noise signal extractor according to a first modification of the first embodiment.

FIG. 6 is a block diagram illustrating a detailed configuration of a noise signal extractor 103 according to a first modification of the first embodiment. Elements that are similar to those illustrated in FIG. 2 or FIG. 4 are given identical reference characters, and detailed descriptions thereof will be omitted.

In the foregoing embodiment, the noise extracting device 100 includes the first noise signal extractor 101 and the second noise signal extractor 102, but this configuration is not a limiting example. As illustrated in FIG. 6, in place of the first noise signal extractor 101 and the second noise signal extractor 102, the noise signal extractor 103 in which the configurations common to the first noise signal extractor 101 and the second noise signal extractor 102 are combined may be provided.

Second Modification

In the foregoing embodiment, the first noise signal extractor 101 and the second noise signal extractor 102 each include the first directionality combiner 20 to the third directionality combiner 40, but this configuration is not a limiting example. The first directionality combiner 20 to the third directionality combiner 40, the first signal absolute value calculator 71 to the third signal absolute value calculator 73, and the signal adder 81 may constitute a single directionality combiner, and the signal cancellation calculator may include only the signal adder 81 that carries out an addition of signals.

In this case, the directionality combiner may carry out directionality combining of the output signal um1 of the first microphone unit 11 and the output signal um2 of the second microphone unit 12 to generate two directionality signals having different noise sensitivities, having matching directionality characteristics to the sound pressure, and having matching acoustic center positions. Here, the two directionality signals are the directionality signal expressed by the term $(|Xm1(\omega)|+|Xm2(\omega)|)$ in the above expression (3) and the directionality signal expressed by the term $|Xm0(\omega)|$.

Then, the signal cancellation calculator according to the present modification may subtract one of the two directionality signals from the other one of the two directionality signals to cancel out the acoustic component from the other one of the directionality signals and may extract the amplitude value of the noise component.

Thus, the signal reconstructor 90 can reconstruct a noise waveform signal from one of the two unidirectional signals (xm1 and xm2) having different principal axis directions added to the directionality signal of the two directionality signals that has a higher noise sensitivity and the output signal of the signal cancellation calculator and output the reconstructed noise waveform signal.

Second Embodiment

Noise Extracting Device 100A

Figure 7:
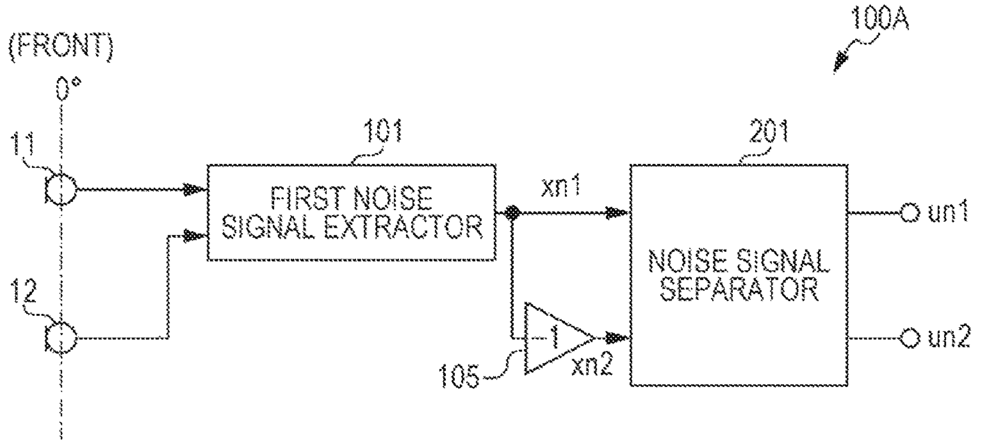
FIG. 7 is a block diagram illustrating a configuration of a noise extracting device according to a second embodiment.

FIG. 7 is a block diagram illustrating a configuration of a noise extracting device 100A according to a second embodiment. Constituent elements that are the same as those illustrated in FIG. 1, FIG. 2, or FIG. 5 are given the same reference characters, and descriptions thereof will be omitted.

The noise extracting device 100A illustrated in FIG. 7 differs from the noise extracting device 100 according to the first embodiment in that the second noise signal extractor 102 is not provided and a signal sign inverter 105 is added.

The signal sign inverter 105 inverts the phase of a first noise signal output from a first noise signal extractor 101 to obtain a second noise signal. In the present embodiment, the signal sign inverter 105 outputs, to a noise signal separator 201, the noise signal xn2 obtained by inverting the sign of the noise signal xn1 output by the first noise signal extractor 101. Since the signal sign inverter 105 replaces the noise signal xn2 output by the second noise signal extractor 102 with a signal obtained by inverting the sign of the output of the first noise signal extractor 101, the signal sign inverter 105 can be regarded as an example of the second noise signal extractor 102.

Advantageous Effects and Others

The reason why the output of the second noise signal extractor 102 can be replaced with a signal obtained by inverting the sign of the output of the first noise signal extractor 101 will be described.

As described in the first embodiment, the noise signal xn1 is a noise component included in the signal xm1 having unidirectional characteristics of a pressure-gradient type output by the second directionality combiner 30. In a similar manner, the noise signal xn2 is a noise component included in the signal xm2 having unidirectional characteristics of a pressure-gradient type output by the third directionality combiner 40.

Here, the signal xm1 and the signal xm2 are expressed by the expression (1) and the expression (2) described above. In the expression (1) and the expression (2) described above, the delay time $\tau$ is set to 0, that is, the signal delay amount between the signal delayer 31 and the signal delayer 41 illustrated in FIG. 2 and FIG. 4, respectively, is set to 0. In this case, for example, it can be seen that the noise signals of wind noises or vibration noises observed in the output signal um1 of the first microphone unit 11 and the output signal um2 of the second microphone unit 12 are signals with their signed mutually inverted from the relationship between the expression (1) and the expression (2).

Here, the expression (1) and the expression (2) differ from each other in the part in which the delay time $\tau$ is on one side, but an influence thereof can be regarded to be small. For example, when there is a correlation between microphone units as in sound waves and a subtraction is carried out between two signals, the magnitude of the phase difference greatly affects the signal amplitude obtained after the subtraction of the two signals. This can be equated to the principle of directionality of a pressure-gradient type. However, noise components have no correlation between the microphone units, and thus the delay time $\tau$ does not affect the noise signal amplitude value.

In addition, when the directionality combining of a pressure-gradient type is carried out, the distance d between two microphone units is typically approximately 5 mm to 20 mm. Therefore, the time lag caused by the delay time $\tau$, namely, the value of the delay time $\tau=d/c$ is sufficiently small with respect to the wavelengths of the signals to be handled, and thus the noise signal xn2 can be approximated to a signal obtained by multiplying xn1 by the negative sign.

As described above, according to the present embodiment, the noise extracting device 100A that can extract individual noise signals generated in the respective microphone units can be achieved.

To be more specific, the noise signal xn1 is extracted from the output signals um1 and um2 of the first and second microphone units 11 and 12 in the first noise signal extractor 101, and the noise signal xn2 obtained by inverting the sign of the noise signal xn1 extracted by the first noise signal extractor 101 is obtained in the signal sign inverter 105. Then, the noise signal separator 201 transforms (separates) the noise signals xn1 and xn2 into the individual noise signals un1 and un2 included in the respective first and second microphone units 11 and 12 and outputs the resulting individual noise signals un1 and un2. In this manner, the noise extracting device 100A according to the present embodiment can extract the noise components mixed in the respective first and second microphone units 11 and 12.

In addition, in the noise extracting device 100A according to the present embodiment, the configuration of the second noise signal extractor 102 can be omitted, and the function thereof can be implemented by the signal sign inverter 105. This configuration makes it possible to extract the noise components mixed in the respective first and second microphone units 11 and 12 with a less calculation heavy configuration.

Third Embodiment

Noise Extracting Device 100B

Figure 8:
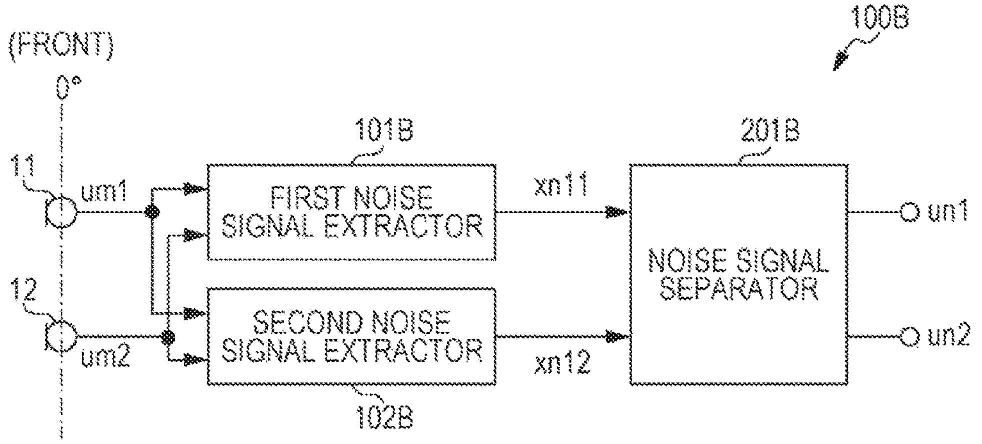
FIG. 8 is a block diagram illustrating a configuration of a noise extracting device according to a third embodiment.

FIG. 8 is a block diagram illustrating a configuration of a noise extracting device 100B according to a third embodiment. Constituent elements that are similar to those illustrated in FIG. 1 are given the same reference characters, and descriptions thereof will be omitted.

The noise extracting device 100B illustrated in FIG. 8 differs from the noise extracting device 100 according to the first embodiment in terms of the condition of the directionality combining in a first noise signal extractor 101B and a second noise signal extractor 102B. Specifically, in the first embodiment and the second embodiment, the difference in the condition of the directionality combining in the first noise signal extractor 101 and the second noise signal extractor 102 is that the principal axis directions of the directionalities are opposite to each other. In contrast, in the third embodiment, the difference in the condition of the directionality combining in the first noise signal extractor 101B and the second noise signal extractor 102B is the difference in the signal level between the microphone units. In FIG. 8, the signal output from the first noise signal extractor 101B is represented by xn11, and the signal output from the second noise signal extractor 102B is represented by xn12.

First Noise Signal Extractor 101B

The first noise signal extractor 101B extracts a first noise signal included in a first directionality signal by subjecting output signals of a first microphone unit 11 and a second microphone unit 12 to directionality combining.

Figure 9:
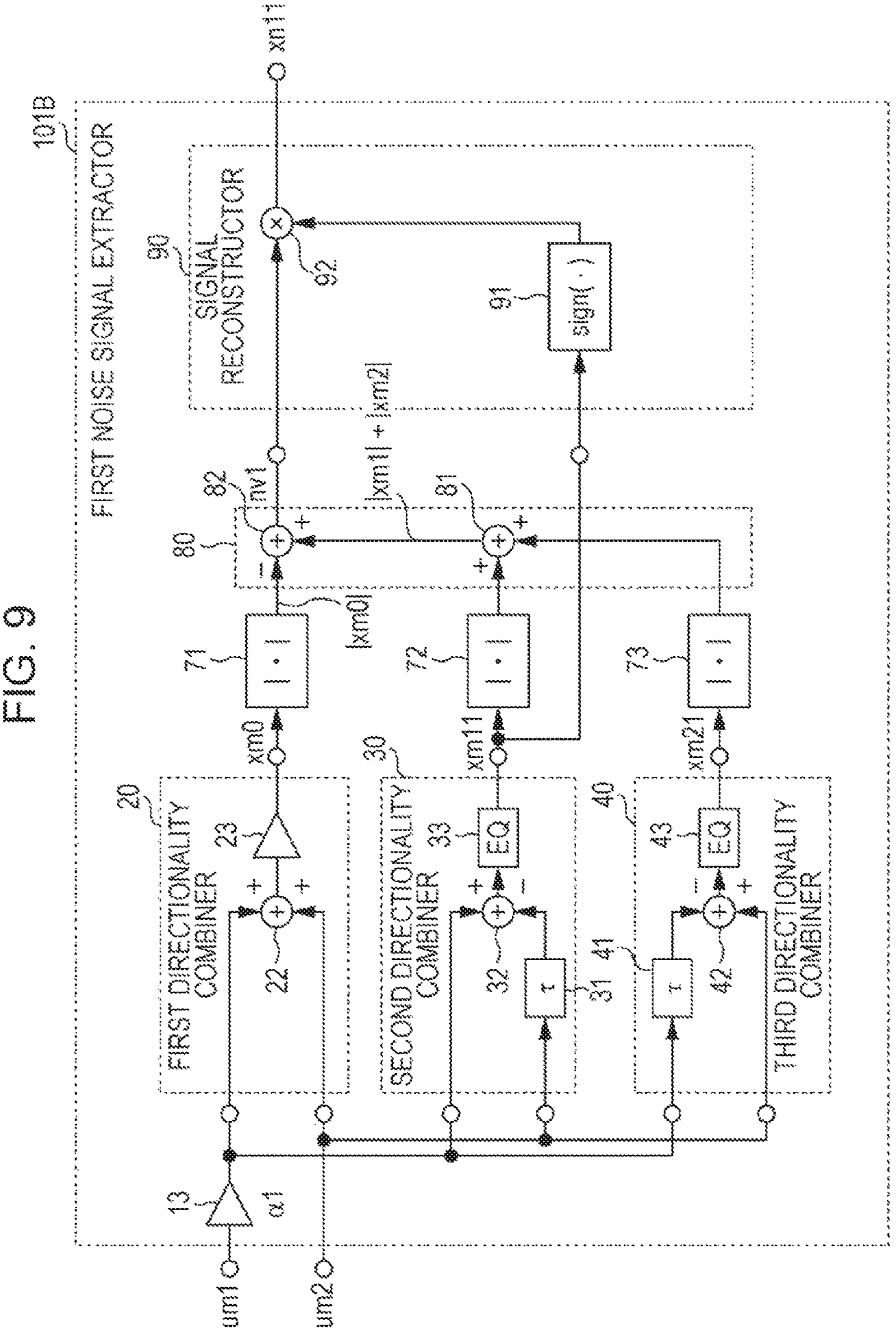
FIG. 9 is a block diagram illustrating a detailed configuration example of a first noise signal extractor according to the third embodiment.

FIG. 9 is a block diagram illustrating a detailed configuration example of the first noise signal extractor 101B according to the third embodiment. Constituent elements that are similar to those illustrated in FIG. 2 are given the same reference characters, and descriptions thereof will be omitted.

The first noise signal extractor 101B illustrated in FIG. 9 differs from the first noise signal extractor 101 illustrated in FIG. 2 in that a signal amplifier 13 that amplifies an output signal um1 of the first microphone unit 11 by α1-fold is added. The first noise signal corresponds to the noise signal xn11, and the first directionality signal corresponds to a signal xm11 output by a second directionality combiner 30. As illustrated in FIG. 3B, for example, the signal xm11 output by the second directionality combiner 30 has the directionality characteristics in which the principal axis direction is to the front at 0 degrees, that is, the front along the axis of directionality is oriented toward the first microphone unit 11 in the line connecting the first microphone unit 11 and the second microphone unit 12.

Here, if the directionality combining of a pressure-gradient type is carried out when there is a difference in the signal level between the microphone units, the influence of the directionality characteristics changes in the direction in which the low-band directionality characteristics are weakened (approaches to being nondirectional). For example, when the distance d between the microphone units is 10 mm and the gain value, which is the value of α1, is in a range of approximately several to ten percent across 1.0, the influence on the directionality appears in an extremely low band, and the degradation of the directionality does not pose a problem in the working band. Therefore, when the first noise signal extractor 101B provides a slight level difference between the output signals of the first and second microphone units 11 and 12 and carries out signal processing similar to that of the first noise signal extractor 101, in a similar manner, the first noise signal extractor 101B can extract the noise signal xn11 included in the signal xm11 output by the second directionality combiner 30.

The signal xm11 output by the second directionality combiner 30 can be expressed as in the following expression (9). Xm11, Um1, and Um2 represent the signals xm11, um1, and um2, which are represented in the time domain, in the frequency domain.

$$Xm11(\omega)=(\alpha1\cdot Um1(\omega)-Um2(\omega)\cdot e^{-j\omega\tau})/(1-A\cdot e^{-j\omega\tau}) \quad (9)$$

In the above, α1 represents the gain value of the signal amplifier 13. The other terms are the same as those described for the expression (1).

Second Noise Signal Extractor 102B

The second noise signal extractor 102B obtains a second noise signal included in a second directionality signal that differs from the first directionality signal in the condition of the directionality combining. Specifically, the second noise signal extractor 102B generates the second directionality signal by subjecting the output signal of the first microphone unit 11 and the output signal of the second microphone unit 12 to directionality combining and extracts the second noise signal included in the second directionality signal. Here, the principal axis direction of the directionality of the first directionality signal and the principal axis direction of the directionality of the second directionality signal are the same as each other. In addition, the first directionality signal and the second directionality signal differ in the combining coefficient used when the output signals of the first and second microphone units 11 and 12 are subjected to directionality combining. In the present embodiment, the combining coefficient is the gain value. Therefore, the first directionality signal and the second directionality signal are signals obtained through directionality combining by multiplying the output signal of one of the first and second microphone units by different gain values.

Figure 10:
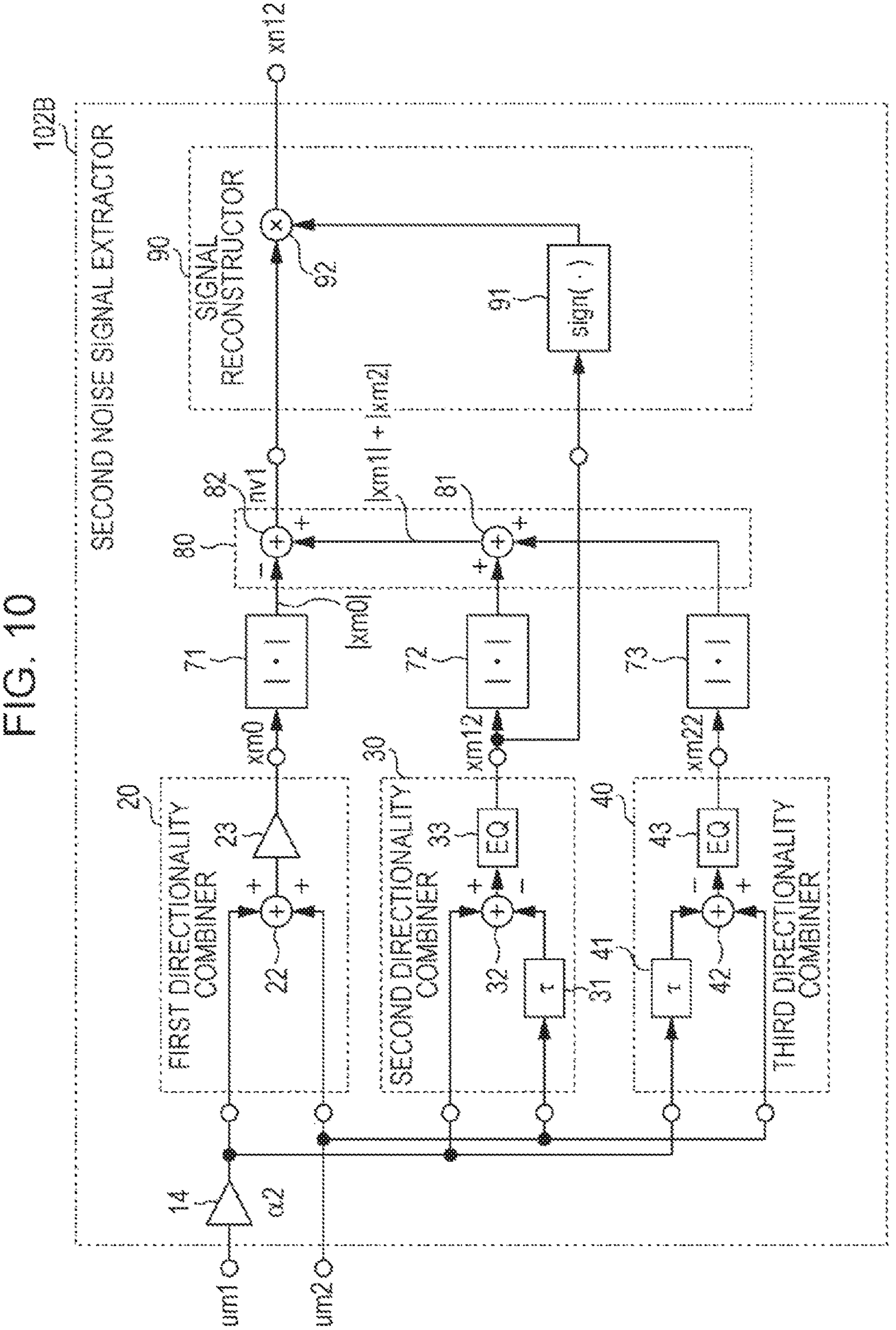
FIG. 10 is a block diagram illustrating a detailed configuration example of a second noise signal extractor according to the third embodiment.

FIG. 10 is a block diagram illustrating a detailed configuration example of the second noise signal extractor 102B according to the third embodiment. Constituent elements that are similar to those illustrated in FIG. 4 or FIG. 9 are given the same reference characters, and descriptions thereof will be omitted.

The second noise signal extractor 102B illustrated in FIG. 10 differs from the second noise signal extractor 102 illustrated in FIG. 4 in that a signal amplifier 14 that amplifies the output signal um1 of the first microphone unit 11 by α2-fold is added and a signal output by the second directionality combiner 30 is input to a signal reconstructor 90. To rephrase, the second noise signal extractor 102B illustrated in FIG. 10 has a configuration similar to that of the first noise signal extractor 101B illustrated in FIG. 9 but differs in that the signal amplifier 13 with the gain of α1 is replaced by the signal amplifier 14 with the gain of α2. Thus, in FIG. 10, the signal output by the second directionality combiner 30 is represented by xm12, and the signal output by the third directionality combiner 40 is represented by xm22. In this manner, the difference from the configuration illustrated in FIG. 9 is indicated.

With this configuration, as illustrated in FIG. 10, the second noise signal extractor 102B can extract the noise signal xn12 included in the signal xm12 output by the second directionality combiner 30. The second noise signal corresponds to the noise signal xn12, and the second directionality signal corresponds to the signal xm12 output by the second directionality combiner 30. As illustrated in FIG. 3B, for example, the signal xm12 output by the second directionality combiner 30 has the directionality characteristics in which the principal axis direction is to the front at 0 degrees, that is, the front along the axis of directionality is oriented toward the first microphone unit 11 in the line connecting the first microphone unit 11 and the second microphone unit 12.

The signal output by the second directionality combiner 30 can be expressed as in the following expression (10). Xm12, Um1, and Um2 represent the signals xm12, um1, and um2, which are represented in the time domain, in the frequency domain.

$$Xm12(\omega)=(\alpha 2-Um1(\omega)-Um2(\omega)\cdot e^{-j\omega\tau})/(1-A\cdot e^{-j\omega\tau}) \qquad (10)$$

In the above, α2 represents the gain value of the signal amplifier 14. The other terms are the same as those described for the expression (1).

Noise Signal Separator 201B

Figure 11:
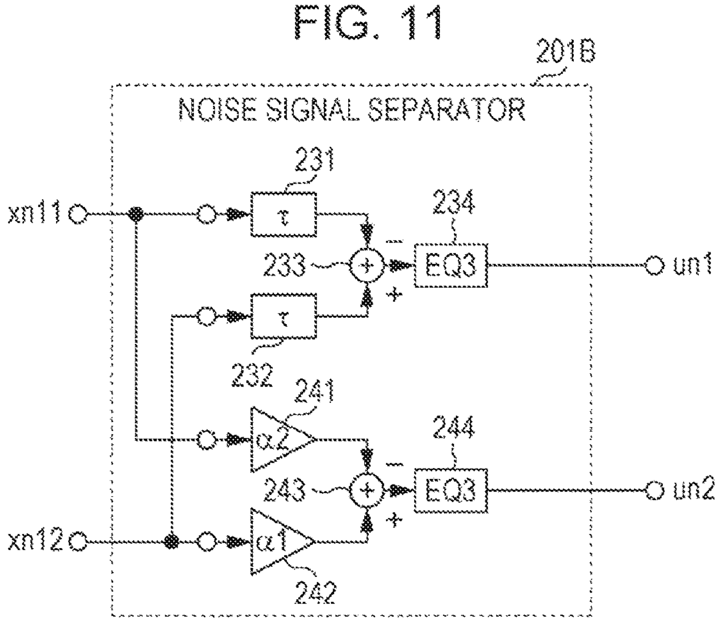
FIG. 11 is a block diagram illustrating a detailed configuration example of a noise signal separator according to the third embodiment.

FIG. 11 is a block diagram illustrating a detailed configuration example of a noise signal separator 201B according to the third embodiment.

The noise signal separator 201B separates the first noise signal and the second noise signal into individual noise signals indicating noises generated in the respective first and second microphone units 11 and 12. The noise signal separator 201B obtains the individual noise signals by transforming the first noise signal and the second noise signal in accordance with a relational expression between the first and second noise signals and the individual noise signals derived from a relational expression indicating a relationship between the first and second directionality signals and the output signals of the first microphone unit 11 and the second microphone unit 12.

In the present embodiment, as illustrated in FIG. 8, the noise signal separator 201B receives inputs of the noise signal xn11 and the noise signal xn12 output from the first noise signal extractor 101B and the second noise signal extractor 102B, respectively. Then, the noise signal separator 201B separates the noise signal xn11 and the noise signal xn12 into an individual noise signal un1 and an individual noise signal un2 indicating the noises included in the first microphone unit 11 and the second microphone unit 12, respectively, and outputs the individual noise signal un1 and the individual noise signal un2. To be more specific, as illustrated in FIG. 11, the noise signal separator 201B includes a signal delayer 231, a signal delayer 232, a signal subtractor 233, a frequency characteristics corrector 234, a signal amplifier 241, a signal amplifier 242, a signal subtractor 243, and a frequency characteristics corrector 244.

The signal delayer 231 and the signal delayer 232 each delay an input signal and output the delayed signal. Specifically, the signal delayer 231 delays the noise signal xn11 output from the first noise signal extractor 101B by a delay time τ and outputs the delayed noise signal xn11 to the signal subtractor 233. The signal delayer 232 delays the noise signal xn12 output from the second noise signal extractor 102B by the delay time τ and outputs the delayed noise signal xn12 to the signal subtractor 233.

The signal amplifier 241 and the signal amplifier 242 each amplify an input signal. Specifically, the signal amplifier 241 amplifies the noise signal xn11 output from the first noise signal extractor 101B with the gain α2 and outputs the amplified noise signal xn11 to the signal subtractor 243. The signal amplifier 242 amplifies the noise signal xn12 output from the second noise signal extractor 102B with the gain α1 and outputs the amplified noise signal xn12 to the signal subtractor 243.

The signal subtractor 233 and the signal subtractor 243 each carry out a subtraction of input signals. Specifically, the signal subtractor 233 subtracts the noise signal xn11 output from the signal delayer 231 and having been delayed by the delay time τ from the noise signal xn12 output from the signal delayer 232 and having been delayed by the delay time τ and outputs the result to the frequency characteristics corrector 234. The signal subtractor 243 subtracts the noise signal xn11 output from the signal amplifier 241 and having been amplified with the gain α2 from the noise signal xn12 output from the signal amplifier 242 and having been amplified with the gain α1 and outputs the result to the frequency characteristics corrector 244.

The frequency characteristics corrector 234 and the frequency characteristics corrector 244 each correct the frequency characteristics of a signal. Specifically, the frequency characteristics corrector 234 outputs the individual noise signal un1 obtained by correcting the frequency characteristics of the signal output from the signal subtractor 233. The frequency characteristics corrector 244 outputs the individual noise signal un2 obtained by correcting the frequency characteristics of the signal output from the signal subtractor 243.

The following description illustrates that the two noise signals xn11 and xn12 included in the two directionality signal patterns (signals xm11 and xm12) can be transformed into the individual noise signals un1 and un2 included in the output signals um1 and um2 of the two respective microphone units. Here, the signal xm11 and the signal xm12 are directionality signals that both have the principal axis direction of the directionality oriented to the front at 0 degrees, as described above, and have different gain values of α1 and α2 on the output signal um1 of the first microphone unit 11.

The relationship between the output signals um1 and um2 of the first and second microphone units 11 and 12 and the signals xm11 and xm12 output by the second directionality combiners 30 in the first and second noise signal extractors 101B and 102B can be expressed as in the following expression (11) by combining the expression (9) and the expression (10) described above.

$$\begin{bmatrix} Xm11(\omega) \\ Xm12(\omega) \end{bmatrix} = \frac{1}{(1-A\cdot e^{-j\omega\tau})} \begin{bmatrix} a1 & -e^{-j\omega\tau} \\ a2 & -e^{-j\omega\tau} \end{bmatrix} \begin{bmatrix} Um1(\omega) \\ Um2(\omega) \end{bmatrix} \qquad (11)$$

When the expression (11) is transformed and cleaned up, as indicated in the following expression (12), a relational expression for deriving the output signals um1 and um2 of the first and second microphone units from the signals xm11 and xm12, which are directionality signals, can be obtained.

$$\begin{bmatrix} Um1(\omega) \\ Um2(\omega) \end{bmatrix} = \left( \frac{(1 - A \cdot e^{-j\omega\tau})}{(a2 - a1) \cdot e^{-j\omega\tau})} \right) \begin{bmatrix} -e^{-j\omega\tau} & e^{-j\omega\tau} \\ -a2 & a1 \end{bmatrix} \begin{bmatrix} Xm11(\omega) \\ Xm12(\omega) \end{bmatrix} \tag{12}$$

The relational expression indicated in the above expression (12) is a transformation for obtaining the output signals um1 and um2 of the first and second microphone units from the signals xm11 and xm12, which are two directionality signal patterns.

When the noise signals xn11 and xn12 included in the signals xm11 and xm12, which are two directionality signal patterns, are substituted into the above expression (12), a transformation (relational expression) indicated in the following expression (13) is obtained. In other words, the use of the transformation indicated in the following expression (13) makes it possible to obtain the individual noise signals un1 and un2 included in the output signals of the first and second microphone units from the noise signals xn11 and xn12 included in the signals xm11 and xm12, which are two directionality signal patterns.

$$\begin{bmatrix} Un1(\omega) \\ Un2(\omega) \end{bmatrix} = \left( \frac{(1 - A \cdot e^{-j\omega\tau})}{(a2 - a1) \cdot e^{-j\omega\tau})} \right) \begin{bmatrix} -e^{-j\omega\tau} & e^{-j\omega\tau} \\ -a2 & a1 \end{bmatrix} \begin{bmatrix} Xn11(\omega) \\ Xn12(\omega) \end{bmatrix} \tag{13}$$

In this manner, the above expression (13) indicating the relational expression between the noise signals xn11 and xn12 and the individual noise signals un1 and un2 can be derived from the relational expression indicating the relationship between the signals xm11 and xm12, which are directionality signals, and the output signals um1 and um2 of the first and second microphone units 11 and 12.

In other words, the noise signal separator 201B can obtain the individual noise signals un1 and un2 by transforming the noise signals xn11 and xn12 in accordance with the above expression (13) indicating the relational expression between the noise signals xn11 and xn12 and the individual noise signals un1 and un2. The noise signal separator 201B illustrated in FIG. 11 corresponds to what is obtained by expressing the above expression (13) in a block diagram. In the above expression (13), the signal delayers 231 and 232 carry out the operation of "$e^{-j\omega\tau}$" in order to delay the signals by the delay time τ. The signal amplifiers 241 and 242 correspond to α2 and α1 in the matrix operation and carry out the calculation of amplifying the signals with the gains α2 and α1. The signal subtractors 233 and 243 carry out the calculation of the subtraction sign in the first column of the matrix, namely, the calculation of the subtraction part in the matrix operation. The frequency characteristics correctors 234 and 244 (EQ2) carry out the calculation of the term that includes the coefficient A in the above expression (13), namely, the calculation of the right-hand side of the following expression (14).

$$EQ2(\omega) = \left( \frac{(1 - A \cdot e^{-j\omega\tau})}{(a2 - a1) \cdot e^{-j\omega\tau})} \right) \tag{14}$$

Advantageous Effects and Others

As described above, according to the present embodiment, the noise extracting device 100B that can extract individual noise signals generated in the respective microphone units can be achieved.

To be more specific, the first and second noise signal extractors 101B and 102B extract the noise signals xn11 and xn12 included in the signals xm11 and xm12, which are directionality signals, having the same directions of directionality and different signal gain differences between the microphone units from the output signals um1 and um2 of the first and second microphone units 11 and 12. Then, the noise signal separator 201B transforms the noise signals xn11 and xn12 included in the directionality signals into the individual noise signals un1 and un2 included in the respective first and second microphone units 11 and 12 and outputs the resulting individual noise signals un1 and un2. In this manner, the noise extracting device 100B according to the present embodiment can extract noise components mixed in the respective first and second microphone units 11 and 12.

Now, the difference between the noise signal separator 201 according to the first embodiment and the noise signal separator 201B according to the present embodiment will be described.

In the noise signal separator 201 according to the first embodiment illustrated in FIG. 5, the transformations of the two noise signals xn1 and xn2 into the output signals un1 and un2 each have objective properties. In the noise signal separator 201 illustrated in FIG. 5, for example, the estimation error of the noise signal xn1 propagates to the signals un1 and un2 along with the signals delayed by the delay time τ. In a similar manner, the estimation error of the noise signal xn2 propagates to the signals un1 and un2 along with the signals delayed by the delay time τ. This means that a phenomenon in which the error component cannot be differentiated from the sound waves arriving from the direction in which the delay time between the signals becomes the delay time τ arises. This is because sound waves from a certain distance at which plane waves can be assumed arrive at the first and second microphone units 11 and 12 at an equal sound pressure level, and thus the error components mean only the time difference by the arrival directions.

Meanwhile, in the noise signal separator 201B according to the present embodiment illustrated in FIG. 11, for example, even if the input signal xn11 has an error, the signal xn11 propagates to the signals un1 and un2 in the state in which the signal xn11 can be distinguished from the sound waves since the signal xn11 is multiplied by the delay time τ and the gain value α2. In other words, the noise signal separator 201B illustrated in FIG. 11 has an advantage in that the error components act differently from the sound waves.

In the present embodiment, the first noise signal extractor 101B and the second noise signal extractor 102B both extract the noise signals included in the directionality signals output by the second directionality combiners 30, but this is not a limiting example. In a similar manner to the first embodiment, for example, the second noise signal extractor 102B may extract the noise signal included in the directionality signal output by the third directionality combiner 40, and the first noise signal extractor 101B may extract the noise signal included in the directionality signal output by the second directionality combiner 30. In other words, by using the signals having the principal axes of the directionality in different directions, a combination in which the directionality is oriented in opposite directions and the signal gain difference differs between the microphone units may be employed.

Fourth Embodiment

Hereinafter, a microphone apparatus 1000 including one of the noise extracting device 100, the noise extracting device 100A, and the noise extracting device 100B described in the first to third embodiments will be described.

Microphone Apparatus 1000

Figure 12:
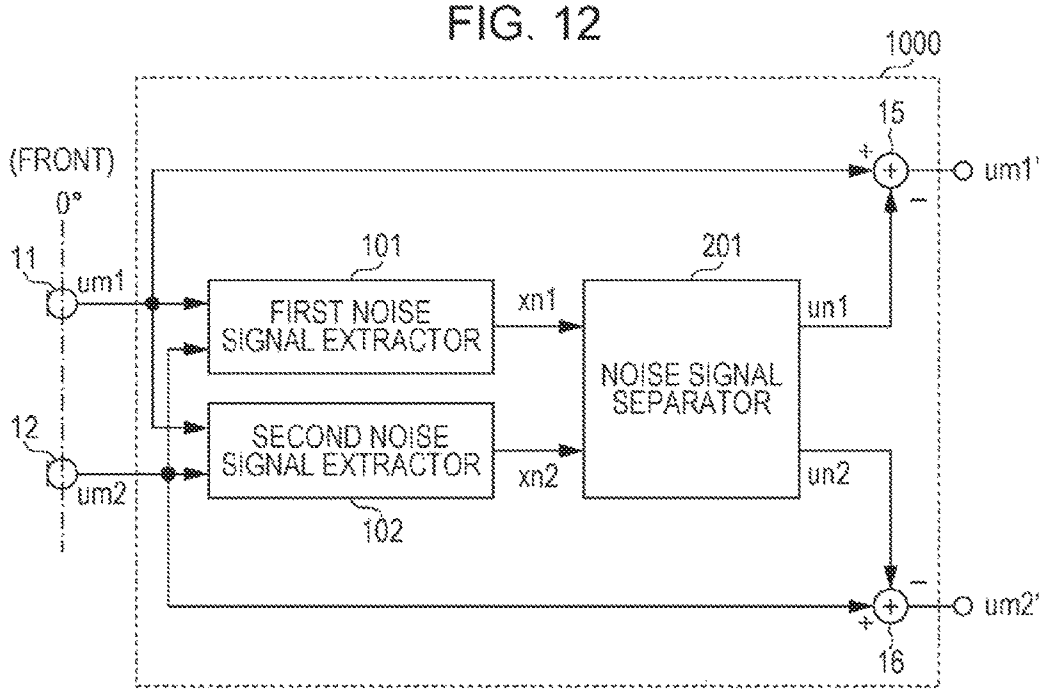
FIG. 12 is a block diagram illustrating an example of a configuration of a microphone apparatus according to a fourth embodiment.

FIG. 12 is a block diagram illustrating an example of a configuration of the microphone apparatus 1000 according to a fourth embodiment. Constituent elements that are the same as those illustrated in FIG. 1 and so on are given the same reference characters, and descriptions thereof will be omitted.

The microphone apparatus 1000 illustrated in FIG. 12 includes a first microphone unit 11, a second microphone unit 12, a signal subtractor 15, a signal subtractor 16, a first noise signal extractor 101, a second noise signal extractor 102, and a noise signal separator 201. In other words, the microphone apparatus 1000 includes the configuration of the noise extracting device 100 according to the first embodiment, the signal subtractor 15, and the signal subtractor 16. FIG. 12 illustrates a case in which the microphone apparatus 1000 includes the configuration of the noise extracting device 100, but this is not a limiting example. The microphone apparatus 1000 may include the configuration of the noise extracting device 100A according to the second embodiment or the configuration of the noise extracting device 100B according to the third embodiment.

Signal Subtractors 15 and 16

The signal subtractors 15 and 16 obtain acoustic signals um1' and um2', which are signals of acoustic components observed in the respective first and second microphone units, by subtracting individual noise signals un1 and un2 from output signals um1 and um2 of the respective first and second microphone units 11 and 12. In the present embodiment, the signal subtractor 15 outputs the acoustic signal um1' obtained by subtracting the individual noise signal un1 output from the noise signal separator 201 from the output signal um1 of the first microphone unit 11. The signal subtractor 16 outputs the acoustic signal um2' obtained by subtracting the individual noise signal un2 output from the noise signal separator 201 from the output signal um2 of the second microphone unit 12.

The individual noise signal un1 output from the noise signal separator 201 is a component of the noise signal of a vibration noise, a wind noise, or a noise unique to the microphone unit included in the output signal um1 of the first microphone unit 11. Therefore, the signal subtractor 15 can obtain the acoustic signal um1' in which the noise component has been removed from the output signal um1 of the first microphone unit 11 by subtracting the individual noise signal un1 from the output signal um1. In a similar manner, the signal subtractor 16 can obtain the acoustic signal um2' in which the noise component has been removed from the output signal um2 of the second microphone unit 12 by subtracting the individual noise signal un2 from the output signal um2.

Advantageous Effects and Others

As described above, according to the present embodiment, the microphone apparatus 1000 that can extract the individual noise signals included in the respective microphone units and obtain the acoustic signals in which the noise components have been removed from the output signals of the microphone units can be achieved. Thus, a microphone apparatus that excels in vibration resistance performance, wind noise resistance performance, and reduced unique noise performance can be achieved.

Modifications

Microphone Apparatus 1000A

Figure 13:
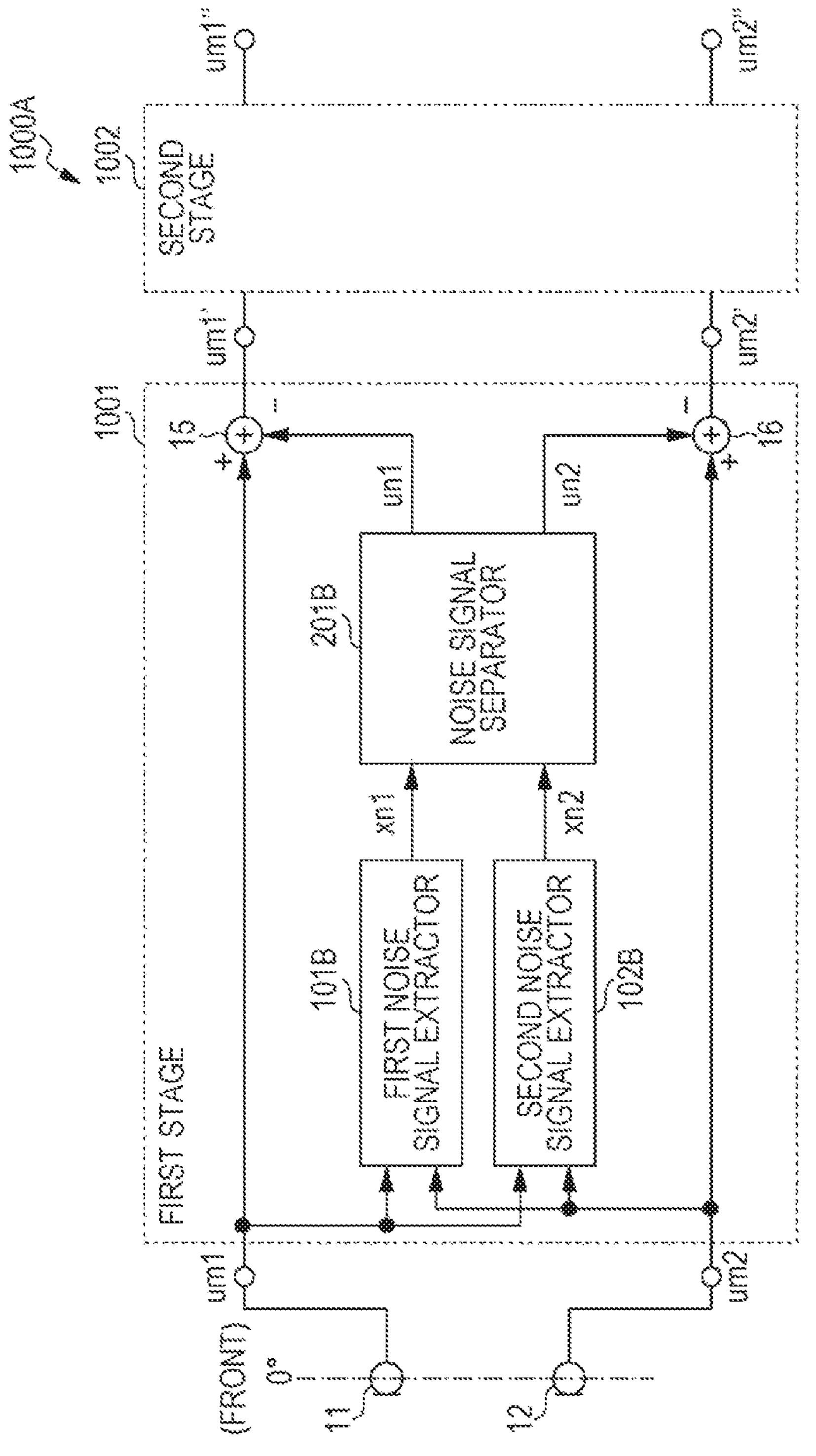
FIG. 13 is a block diagram illustrating an example of a configuration of a microphone apparatus according to the fourth embodiment.

FIG. 13 is a block diagram illustrating an example of a configuration of a microphone apparatus 1000A according to a modification of the fourth embodiment. Constituent elements that are the same as those illustrated in FIG. 8 or FIG. 12 are given the same reference characters, and descriptions thereof will be omitted.

The microphone apparatus 1000A illustrated in FIG. 13 includes a first microphone unit 11, a second microphone unit 12, a first stage 1001, and a second stage 1002. The first stage 1001 and the second stage 1002 each include a signal subtractor 15, a signal subtractor 16, a first noise signal extractor 101B, a second noise signal extractor 102B, and a noise signal separator 201B. In other words, the first stage 1001 and the second stage 1002 each include the configuration of the noise extracting device 100B according to the third embodiment, the signal subtractor 15, and the signal subtractor 16. In this manner, the microphone apparatus 1000A has a configuration in which the configuration of the noise extracting device 100B, the signal subtractor 15, and the signal subtractor 16 are connected in multistage.

The first stage 1001 receives inputs of output signals um1 and um2 of the first and second microphone units 11 and 12, obtains acoustic signals um1' and um2' in which noise components have been removed from the output signals um1 and um2 of the first and second microphone units 11 and 12, and outputs the acoustic signals um1' and um2' to the second stage 1002. To be more specific, the signal subtractors 15 and 16 in the first stage 1001 obtain the acoustic signals um1' and um2', which are signals of the acoustic components observed in the respective first and second microphone units 11 and 12. Then, the signal subtractors 15 and 16 in the first stage 1001 output the acoustic signals um1' and um2' to the second stage 1002 as the output signals of the respective first and second microphone units 11 and 12.

The second stage 1002 receives inputs of the acoustic signals um1' and um2' output from the first stage 1001. The second stage 1002 extracts residual noises that could not be removed from the acoustic signals um1' and um2' in the first stage 1001 due to an error factor or the like to obtain acoustic signals um1" and um2" in which the extracted residual noises have been removed from the acoustic signals um1' and um2' and outputs the obtained acoustic signals um1" and um2".

To be more specific, the first noise signal extractor 101B and the second noise signal extractor 102B in the second stage 1002 extract residual noises included in the signals obtained by subjecting the acoustic signals um1' and um2' to directionality combining and outputs the extracted residual noises to the noise signal separator 201B in the second stage 1002. Here, for example, the first noise signal extractor 101B and the second noise signal extractor 102B extract a third noise signal, which is a residual noise included in a third directionality signal obtained by subjecting the acoustic signals um1' and um2' to directionality combining, and a fourth noise signal, which is a residual noise included in a fourth directionality signal obtained through directionality combining in which the condition of the directionality combining differs from that for the third directionality signal, and outputs the third noise signal and the fourth noise signal to the noise signal separator 201B in the second stage 1002. The noise signal separator 201B in the second stage 1002 separates the above-described noise signals, which are the residual noises included in the signals obtained by subjecting the acoustic signals um1' and um2' to directionality combining, into individual noise signals indicating the noises generated in the respective first and second microphone units 11 and 12 included in the acoustic signals um1' and um2' and outputs the individual noise signals to the signal subtractors 15 and 16 in the second stage 1002. The signal subtractors 15 and 16 in the second stage 1002 subtract the individual noise signals included in the acoustic signals um1' and um2' output from the noise signal separator 201B in the second stage 1002 from the acoustic signals um1' and um2'. In this manner, the second stage 1002 can obtain the acoustic signal um1" and um2", which are signals of the acoustic components observed in the respective first and second microphone units 11 and 12.

As illustrated in FIG. 13, the microphone apparatus 1000A has a configuration in which the configuration of the noise extracting device 100B according to the third embodiment, the signal subtractor 15, and the signal subtractor 16 are connected in two stages, but this is not a limiting example, and a multistage configuration of three or more stages may be employed.

Advantageous Effects and Others

As described above, according to the microphone apparatus 1000A of the present modification, the noise component removing performance can be further increased as compared to the microphone apparatus 1000. Thus, a microphone apparatus that further excels in vibration resistance performance, wind noise resistance performance, and reduced unique noise performance can be achieved.

It is preferable that the microphone apparatus 1000A of the present modification include the configuration of the noise extracting device 100B according to the third embodiment in the first stage. This is because the individual noise signals un1 and un2 output from the configuration of the noise extracting device 100B according to the third embodiment in the first stage do no hold the relationship similar to that of the sound waves between individual noise signals.

Other Embodiments

Figure 14:
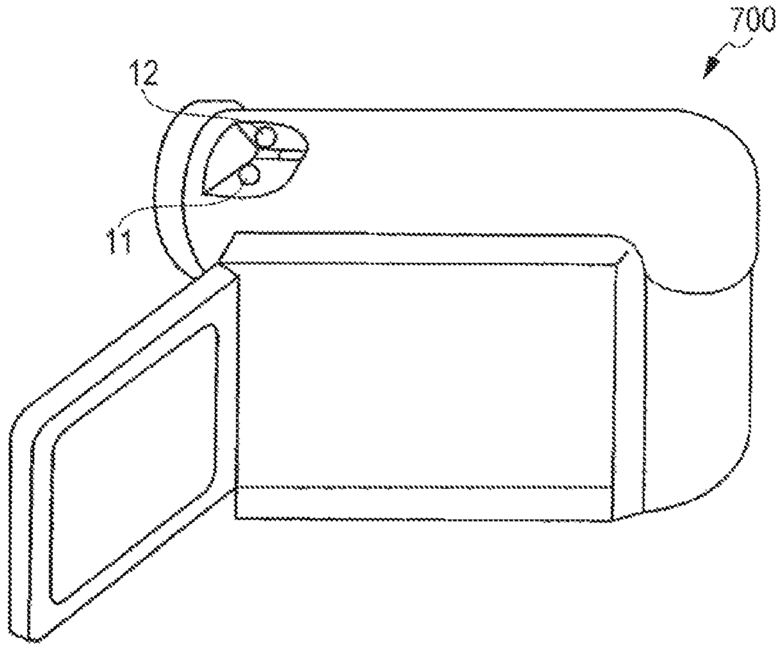
FIG. 14 illustrates an example of an application in which a microphone apparatus according to the fourth embodiment can be used.

FIG. 14 illustrates an example of an application in which the microphone apparatus according to the fourth embodiment can be used. Specifically, the microphone apparatus described in the fourth embodiment and so on can be used as a microphone apparatus that excels in noise resistance performance, wind noise resistance performance, and reduced unique noise performance in a video camera 700 as illustrated in FIG. 14.

In addition, the noise extracting devices described in the foregoing first to third embodiments and so on can extract a vibration noise included in an output signal of a microphone and can thus detect only the vibrations from the output signal of the microphone with high accuracy. Therefore, the vibration noise extracting devices described in the foregoing first to third embodiments and so on can be used as a vibration sensor or a complex sensor.

In addition, the noise extracting devices described in the foregoing first to third embodiments and so on may be used in preprocessing of microphone array signal processing for adaptive beamforming, sound source separation, sound source localization, or the like. Thus, vibration resistance performance, wind noise resistance performance, and reduced unique noise performance in the microphone array signal processing for adaptive beamforming, sound source separation, sound source localization, or the like can be increased.

Thus far, the noise extracting devices and the microphone apparatuses according to the aspects of the present disclosure have been described with reference to the embodiments, but the present disclosure is not limited to these embodiments. For example, another embodiment implemented by combining the constituent elements described in the present specification as desired or by removing some of the constituent elements may also serve as an embodiment of the present disclosure. In addition, the present disclosure also encompasses a modification obtained by making various alterations, to the foregoing embodiments, that a person skilled in the art can conceive of within the spirit of the present disclosure, namely, within the scope that does not depart from what is construed by the wordings set forth in the claims.

In addition, the modes indicated hereinafter may also be encompassed by the scope of one or a plurality of aspects of the present disclosure.

(1) Some of the constituent elements constituting the noise extracting devices and the microphone apparatuses described above may be a computer system constituted by a microprocessor, a read-only memory (ROM), a random-access memory (RAM), a hard disk unit, a display unit, a keyboard, a mouse, and so on. The RAM or the hard disk unit stores a computer program. The microprocessor operates in accordance with the computer program and thus implements its functions. Here, the computer program is composed of a combination of a plurality of instruction codes providing instructions to the computer in order to implement predetermined functions.

(2) Some of the constituent elements constituting the noise extracting devices and the microphone apparatuses described above may be constituted by a single system large scale integration (LSI). A system LSI is an ultra-multifunctional LSI manufactured by integrating a plurality of components onto a single chip and specifically is a computer system that includes a microprocessor, a ROM, a RAM and so on. The RAM stores a computer program. The microprocessor operates in accordance with the computer program, and thus the system LSI implements its functions.

(3) Some of the constituent elements constituting the noise extracting devices and the microphone apparatuses described above may be constituted by an IC card or a single module that can be attached to and detached from each device. The IC card or the module is a computer system constituted by a microprocessor, a ROM, a RAM, and so on. The IC card or the module may include the ultra-multifunctional LSI described above. The microprocessor operates in accordance with the computer program, and thus the IC card or the module implements its functions. The IC card or the module may be tamper resistant.

(4) In addition, some of the constituent elements constituting the noise extracting devices and the microphone apparatuses described above may be the computer program or the digital signals that are recorded in a computer-readable recording medium, and examples of the computer-readable recording medium include a flexible disk, a hard disk, a CD-ROM, an MO, a digital versatile disc (DVD), a DVD-ROM, a DVD-RAM a Blu-ray (registered trademark) disc (BD), and a semiconductor memory. Some of the stated constituent elements may be the digital signals recorded in such a recording medium.

In addition, some of the constituent elements constituting the noise extracting devices and the microphone apparatuses described above may be the computer program or the digital signals transmitted via a telecommunication circuit, a wireless or wired communication circuit, a network represented by the internet, data broadcasting, and so on.

(5) The present disclosure may be the methods described above. In addition, the present disclosure may be a computer program that implements these methods with a computer or may be digital signals composed of the computer program. Herein, for example, a noise extracting method according to an aspect of the present disclosure may include extracting a first noise signal included in a first directionality signal obtained by subjecting output signals of first and second microphone units that are provided at spatially different positions and pick up sounds to directionality combining, obtaining a second noise signal included in a second directionality signal that differs from the first directionality signal in a condition of the directionality combining, and separating the first noise signal and the second noise signal into individual noise signals indicating noises generated in the respective first and second microphone units. In addition, a program according to an aspect of the present disclosure may cause a computer to execute extracting a first noise signal included in a first directionality signal obtained by subjecting output signals of first and second microphone units that are provided at spatially different positions and pick up sounds to directionality combining, obtaining a second noise signal included in a second directionality signal that differs from the first directionality signal in a condition of the directionality combining, and separating the first noise signal and the second noise signal into individual noise signals indicating noises generated in the respective first and second microphone units.

(6) In addition, the present disclosure may be a computer system provided with a microprocessor and a memory, the memory may store the computer program, and the microprocessor may operate in accordance with the computer program.

(7) In addition, by recoding the program or the digital signals into the recording medium and transporting the recording medium or by transmitting the program or the digital signals via the network or the like, the program or the digital signals may be implemented by another stand-alone computer system.

(8) The foregoing embodiments and modifications may be combined.

The present disclose can be used in a noise extracting device and a microphone apparatus. In particular, the present disclosure can be used in a noise extracting device that can extract a vibration noise, a wind noise, or a noise unique to a unit and in a microphone apparatus that excels in vibration resistance performance, wind noise resistance performance, and reduced unique noise performance.

What is claimed is:

1. A noise extracting device, comprising:

first and second microphones that are provided at spatially different positions and pick up sounds;

a first noise signal extractor that extracts a first noise signal included in a first directionality signal obtained by subjecting output signals of the first and second microphones to directionality combining;

a second noise signal extractor that obtains a second noise signal included in a second directionality signal that differs from the first directionality signal in a condition of the directionality combining; and a noise signal separator that separates the first noise signal and the second noise signal into individual noise signals indicating noises generated in the respective first and second microphones.

2. The noise extracting device according to claim 1, wherein the noise signal separator obtains the individual noise signals by transforming the first noise signal and the second noise signal in accordance with a relational expression between the first and second noise signals and the individual noise signals derived from a relational expression indicating a relationship between the first and second directionality signals and the output signals of the first and second microphones.

3. The noise extracting device according to claim 1, wherein the second noise signal extractor generates the second directionality signal by subjecting the output signals of the first and second microphones to the directionality combining and extracts the second noise signal included in the second directionality signal.

4. The noise extracting device according to claim 3, wherein the first noise signal extractor and the second noise signal extractor each include a directionality combiner that subjects the output signals of the first and second microphones to the directionality combining to generate first and second directionality signals having different noise sensitivities, having matching directionality characteristics to a sound pressure, and having matching acoustic center positions, a signal cancellation calculator that subtracts the first directionality signal from the second directionality signal to cancel out an acoustic component from the second directionality signal and extracts an amplitude value of a noise component, and a signal reconstructor that reconstructs a noise waveform signal from one of two unidirectional signals with different principal axis directions that have been added to one of the first and second directionality signals having a higher noise sensitivity and outputs the noise waveform signal.

5. The noise extracting device according to claim 1, wherein the principal axis direction of the directionality of the first directionality signal and the principal axis direction of the directionality of the second directionality signal are opposite to each other.

6. The noise extracting device according to claim 1, wherein the second noise signal is in an opposite phase to the first noise signal, and wherein the second noise signal extractor obtains the second noise signal by inverting the phase of the first noise signal output from the first noise signal extractor.

7. The noise extracting device according to claim 1, wherein the principal axis direction of the directionality of the first directionality signal and the principal axis direction of the directionality of the second directionality signal are the same as each other, and wherein the first directionality signal and the second directionality signal have different combining coefficients used when the output signals of the first and second microphones are subjected to the directionality combining.

8. The noise extracting device according to claim 7, wherein the combining coefficients are gain values, and wherein the first directionality signal and the second directionality signal are obtained through the directionality combining in which one of the output signals of the first and second microphones is multiplied by different gain values.

9. The noise extracting device according to claim 1, wherein the individual noise signals indicate noises including at least one of wind noises and vibration noises generated in the respective first and second microphones.

10. A microphone apparatus, comprising:

the noise extracting device according to claim 1; and first and second signal subtractors that subtract the individual noise signals from the output signals of the first and second microphones to obtain acoustic signals of acoustic components observed in the respective first and second microphones.

11. A microphone apparatus, comprising:

the noise extracting device according to claim 7; and first and second signal subtractors that subtract the individual noise signals from the output signals of the first and second microphones to obtain first acoustic signals of acoustic components observed in the respective first and second microphones, wherein the first and second signal subtractors output the first acoustic signals to the noise extracting device as the output signals of the first and second microphones and subtract, from the first acoustic signals, the individual noise signals indicating noises generated in the respective first and second microphones included in the first acoustic signals output from the noise extracting device to obtain second acoustic signals of acoustic components observed in the respective first and second microphones.

12. The microphone apparatus according to claim 11, wherein the first and second signal subtractors output the first acoustic signals to the first noise signal extractor and the second noise signal extractor as the output signals of the respective first and second microphones, wherein the first noise signal extractor and the second noise signal extractor extract a third noise signal included in a third directionality signal obtained by subjecting the first acoustic signals to the directionality combining and a fourth noise signal included in a fourth directionality signal obtained by subjecting the first acoustic signals to the directionality combining under a condition different from that of the third directionality signal and output the third noise signal and the fourth noise signal to the noise signal separator, wherein the noise signal separator separates the third noise signal and the fourth noise signal into individual noise signals indicating noises generated in the respective first and second microphones included in the first acoustic signals and outputs the individual noise signals to the first and second signal subtractors, and wherein the first and second signal subtractors subtract, from the first acoustic signals, the individual noise signals indicating the noises generated in the respective first and second microphones included in the first acoustic signals output from the noise signal separator.

13. A noise extracting method, comprising:

extracting a first noise signal included in a first directionality signal obtained by subjecting output signals of first and second microphones that are provided at spatially different positions and pick up sounds to directionality combining;

obtaining a second noise signal included in a second directionality signal that differs from the first directionality signal in a condition of the directionality combining; and separating the first noise signal and the second noise signal into individual noise signals indicating noises generated in the respective first and second microphones.

14. A non-transitory computer-readable recording medium storing a program that, upon being executed in a computer, causes the computer to execute:

extracting a first noise signal included in a first directionality signal obtained by subjecting output signals of first and second microphones that are provided at spatially different positions and pick up sounds to directionality combining;

obtaining a second noise signal included in a second directionality signal that differs from the first directionality signal in a condition of the directionality combining; and separating the first noise signal and the second noise signal into individual noise signals indicating noises generated in the respective first and second microphones.

* * * * *